United States Patent [19]

Yoshino et al.

[11] Patent Number: 4,835,509
[45] Date of Patent: May 30, 1989

[54] NONCONTACT POTENTIOMETER

[75] Inventors: Yoshimi Yoshino, Inuyama; Toshikazu Arasuna, Kariya; Kenichi Ao; Katsuhiko Ariga, both of Oobu; Toshikazu Matsushita; Ichiro Izawa, both of Anjo, all of Japan

[73] Assignee: Nippondenso Co., Ltd., Kariya, Japan

[21] Appl. No.: 76,891

[22] Filed: Jul. 23, 1987

[30] Foreign Application Priority Data

| Jul. 29, 1986 | [JP] | Japan | 61-178322 |
| Jul. 30, 1986 | [JP] | Japan | 61-177726 |
| Aug. 25, 1986 | [JP] | Japan | 61-198774 |
| Aug. 25, 1986 | [JP] | Japan | 61-198773 |
| Aug. 25, 1986 | [JP] | Japan | 61-198776 |
| Aug. 25, 1986 | [JP] | Japan | 61-198775 |
| Aug. 25, 1986 | [JP] | Japan | 61-198777 |
| Feb. 2, 1987 | [JP] | Japan | 62-23195 |

[51] Int. Cl.$^4$ ............................................. H01L 43/00
[52] U.S. Cl. .................... 338/32 R; 338/162
[58] Field of Search ................ 338/32 R, 32 H, 162, 338/189; 324/208, 247, 207, 244, 251

[56] References Cited

U.S. PATENT DOCUMENTS

| 4,021,728 | 5/1977 | Makino et al. | 338/32 R X |
| 4,079,360 | 3/1978 | Ookubo et al. | 338/32 R X |
| 4,319,188 | 3/1982 | Ito et al. | 324/173 |
| 4,361,805 | 11/1982 | Narimatsu et al. | 338/32 R X |
| 4,570,118 | 2/1986 | Tomczak et al. | 324/108 |
| 4,661,773 | 4/1987 | Kawakita et al. | 338/32 H X |

FOREIGN PATENT DOCUMENTS

| 3308352 | 9/1983 | Fed. Rep. of Germany . |
| 3308404 | 9/1983 | Fed. Rep. of Germany . |
| 54-115257 | 9/1979 | Japan . |
| 58-16580 | 1/1983 | Japan . |
| 58-154612 | 9/1983 | Japan . |
| 58-154613 | 9/1983 | Japan . |
| 58-154615 | 9/1983 | Japan . |
| 59-111011 | 6/1984 | Japan . |
| 59-159578 | 9/1984 | Japan . |
| 60-137079 | 7/1985 | Japan . |
| 60-41477 | 9/1985 | Japan . |
| 61-142782 | 6/1986 | Japan . |

Primary Examiner—E. A. Goldberg
Assistant Examiner—M. M. Lateef
Attorney, Agent, or Firm—Cushman, Darby & Cushman

[57] ABSTRACT

A potentiometer includes a magnetoresistive element made of ferromagnetic material. A device applies a magnetic field to the magnetoresistive element. An absolute value of the magnetic field applied to the magnetoresistive element is equal to or greater than a saturation magnetic field with respect to the ferromagnetic magnetoresistive element. The magnetic field applying device is movable relative to the magnetoresistive element.

7 Claims, 25 Drawing Sheets

NONCONTACT POTENTIOMETER

BACKGROUND OF THE INVENTION

1. Field of the Invention

This invention relates to a noncontact potentiometer.

2. Description of the Prior Art

Noncontact potentiometers generally include a magnetoresistive element, a magnet spaced from the magnetoresistive element, and a movable control arm fixed to the magnet. The magnet applies magnetic field to the magnetoresistive element. The magnet moves relative to the magnetoresistive element in accordance with the position of the control arm. The resistance of the magnetoresistive element varies as the magnet moves relative to the magnetoresistive element, so that the resistance of the magnetoresistive element depends on the position of the control arm.

In cases where the magnetoresistive element is made of indium antimonide (InSb), produced potentiometers tend to have different output characteristics respectively so that a yield in manufacture is generally low. The resistance of a potentiometer is sometimes required to vary linearly with the position of the control arm. The magnetoresistive element made of InSb tends to cause unacceptable linearity of a potentiometer.

SUMMARY OF THE INVENTION

It is an object of this invention to provide a noncontact potentiometer which allows a high yield in manufacture.

It is another object of this invention to provide a potentiometer which has acceptable linearity.

In accordance with a first aspect of this invention, a potentiometer includes a magnetoresistive element made of ferromagnetic material. A device applies a magnetic field to the magnetoresistive element. An absolute value of the magnetic field applied to the magnetoresistive element is equal to or greater than a saturation magnetic field with respect to the ferromagnetic magnetoresistive element. The magnetic field applying device is movable relative to the magnetoresistive element.

In accordance with a second aspect of this invention, a potentiometer includes a magnetoresistive element made of a material having a resistance which is essentially constant when an intensity of a magnetic field applied thereto exceeds a reference value. A device actually applies a magnetic field to a portion of the magnetoresistive element. The magnetic field actually applied to the portion of the magnetoresistive element has an intensity which exceeds the reference value. The actually applied magnetic field is movable relative to the magnetoresistive element.

In accordance with a third aspect of this invention, a potentiometer includes a magnetoresistive element made of ferromagnetic material. A first magnetic field and a second magnetic field are applied to the magnetoresistive element. The first magnetic field is stationary with respect to the magnetoresistive element. The second magnetic field is movable relative to the magnetoresistive element. An absolute value of a resultant of the first and second magnetic fields is equal to or greater than a saturation magnetic field with respect to the ferromagnetic magnetoresistive element.

BRIEF DESCRIPTION OF THE DRAWINGS

The same reference characters denote the corresponding or like elements throughout the drawings.

DESCRIPTION OF THE FIRST PREFERRED EMBODIMENT

Figure 1:
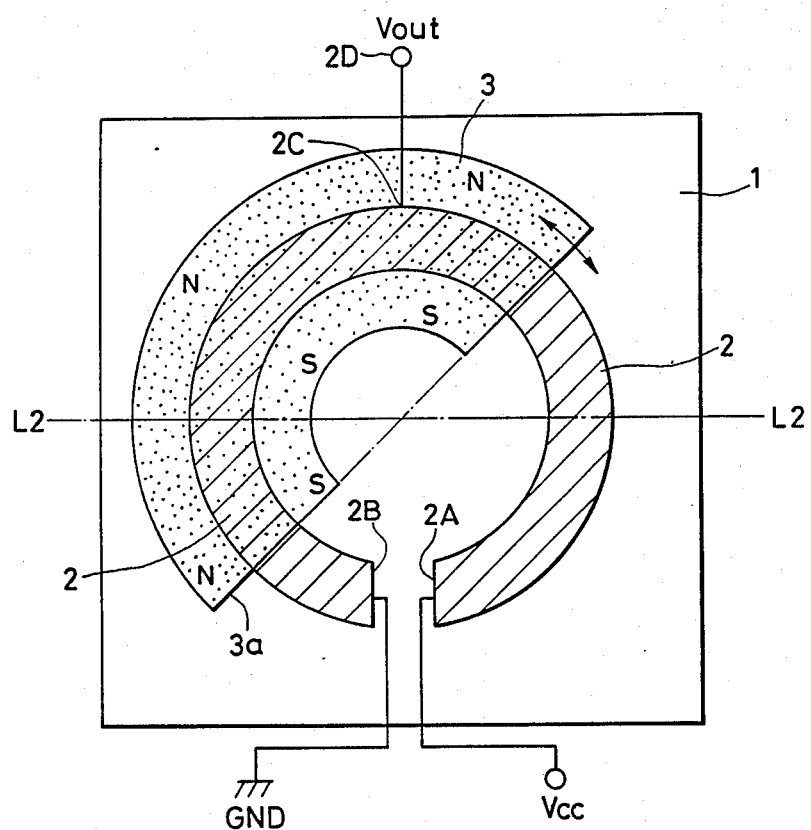
FIG. 1 is a top view of a noncontact potentiometer according to embodiment of this invention.
Figure 2:
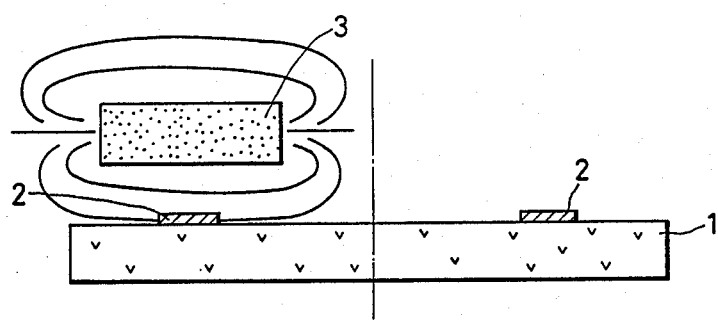
FIG. 2 is a sectional view taken along the line L2—L2 of FIG. 1.

With reference to FIGS. 1 and 2, a noncontact potentiometer according to a first embodiment of this invention includes a substrate or base plate 1 made of insulating material. A circular or annular ferromagnetic magnetoresistive element 2 fixedly extends on an upper surface of the substrate 1. The magnetoresistive element 2 is composed of a film or layer of ferromagnetic material, such as an alloy of nickel and iron or an alloy of nickel and cobalt. The width of the magnetoresistive element 2 is greater than the thickness of the magnetoresistive element 2. In other words, the radial dimension of the magnetoresistive element 2 is greater than the axial dimension of the magnetoresistive element 2. The magnetoresistive element 2 has an opening, and opposing ends 2A and 2B defining the opening. The first end 2A of the magnetoresistive element 2 is electrically connected to the positive terminal of a constant voltage source (not shown). The second end 2B of the magnetoresistive element 2 is electrically connected to the negative terminal of the constant voltage source via the ground. Accordingly, the first end 2A of the magnetoresistive element 2 is subjected to a constant potential Vcc with respect to the second end 2B of the magnetoresistive element 2, so that a constant electric current flows through the magnetoresistive element 2. A point 2C of the magnetoresistive element 2 between the ends 2A and 2B is electrically connected to an output terminal 2D. This point 2C is preferably equidistant from the ends 2A and 2B. It should be noted this point 2C may be in other locations between the ends 2A and 2B.

A sectoral or semicircular permanent magnet 3 opposes the upper surface of the substrate 1 on which the magnetoresitive element 2 extends. It should be noted that the permanent magnet 3 may oppose the lower surface of the substrate 1. The permanent magnet 3 is coaxial with the magnetoresistive element 2. The permanent magnet 3 is axially separated from the magnetoresistive element 2 by a predetermined gap. The permanent magnet 3 is rotatably supported by a suitable mechanism (not shown). Specifically, the permanent magnet 3 can rotate about the central axis of the magnetoresistive element 2 and thus rotate circumferentially with respect to the magnetoresistive element 2. The permanent magnet 3 applies a magnetic field to the magnetoresistive element 2. The permanent magnet 3 is designed so that the absolute value of the intensity of the magnetic field applied to the magnetoresistive element 2 is equal to or greater than the intensity of a saturation magnetic field related to the magnetoresitive element 2. Furthermore, the permanent magnet 3 is designed so that the direction of the magnetic field applied to the magnetoresistive element 2 extends radially with respect to the magnetoresistive element 2. In general, the permanent magnet 3 is connected to a control shaft or arm (not shown) so that the permanent magnet 3 rotates together with the control shaft or arm.

It should be noted that the permanent magnet 3 may be replaced by an electromagnet.

Figure 3:
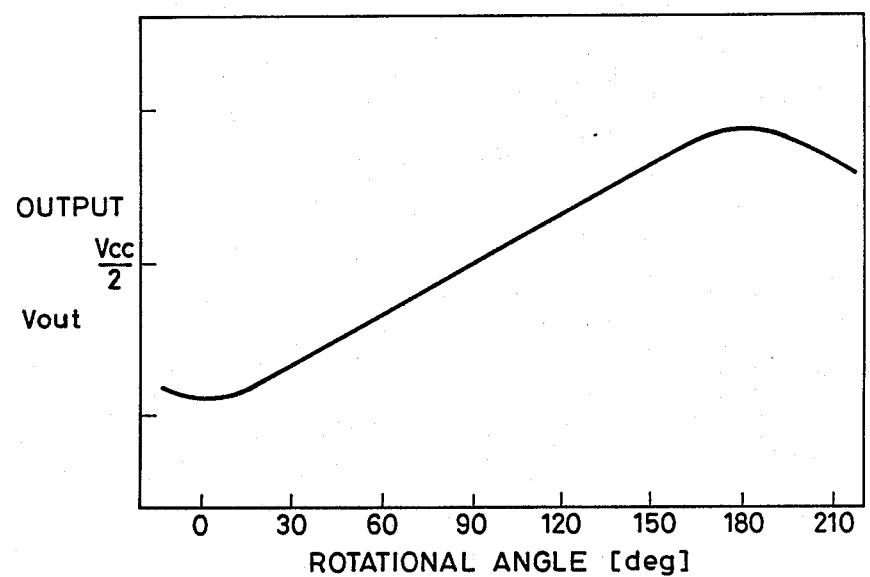
FIG. 3 is a graph showing the relationship between the output potential and the rotational angle of the permanent magnet in the noncontact potentiometer of FIGS. 1 and 2.

The resistance of a portion of the magnetoresistive element 2 decreases when the portion of the magnetoresistive element 2 is exposed to a magnetic field extending in a direction perpendicular to the direction of an electric current flowing in the portion of the magnetoresistive element 2. As the permanent magnet 3 rotates circumferentially with respect to the magnetoresistive element 2, the resistance-decreased portion of the magnetoresistive element 2 moves. Accordingly, as shown in FIG. 3, the potential Vout at the output terminal 2D varies linearly with the rotational angle of the permanent magnet 3. It should be noted that the potential Vout at the output terminal 2D equals one of divided values of the constant voltage Vcc which depends on the ratio of the total resistance of the magnetoresistive element 2 to the resistance of the portion of the magnetoresistive element 2 extending between the end 2B to the point 2C.

In the case of a semicircular permanent magnet 3, essentially the half area of the magnetoresistive element 2 is exposed to the magnetic field generated by the permanent magnet 3. The semicircular design of the permanent magnet 3 ensures that the output potential Vout sensitively varies with the position of the permanent magnet 3. It should be noted that the permanent magnet 3 may be of other sectoral shapes or rectangular shapes.

The rotational angle of the permanent magnet 3 of FIG. 3 is defined such that at the rotational angle equal to 0, a straight edge or chord 3a of the permanent magnet 3 extends perpendicular to the line L2—L2 of FIG. 1 and the permanent magnet 3 extends in a left-hand area as viewed in FIG. 1. When the permanent magnet 3 rotates clockwise as viewed in FIG. 1, the rotational angle of the permanent magnet increases from 0.

Figure 4:
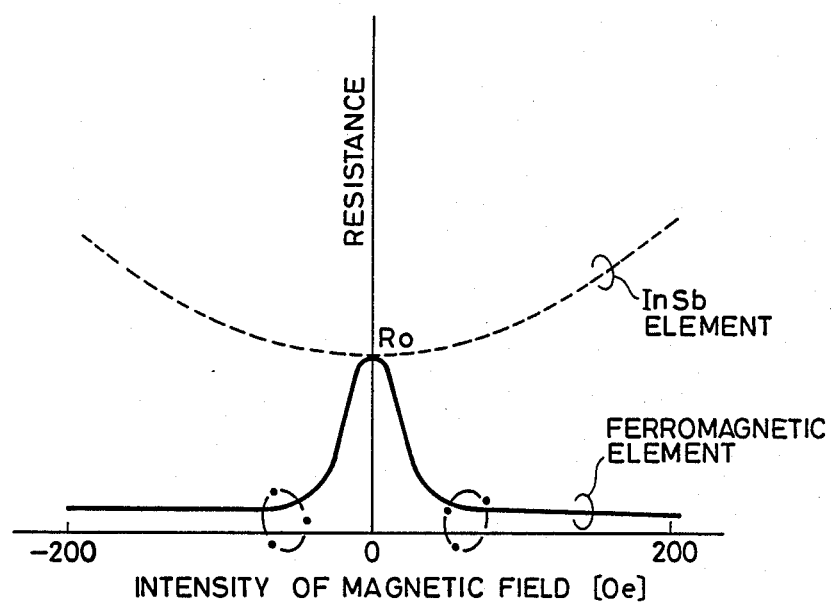
FIG. 4 is a diagram showing the relationship between the resistance of a ferromagnetic magnetoresistive element and the intensity of applied magnetic field, and the relationship between the resistance of a magnetoresistive element made of indium antimonide (InSb) and the intensity of applied magnetic field.

In the case of a ferromagnetic magnetoresistive element 2 made of an alloy containing 87%-nickel and 13%-iron by weight, as shown by the solid curve of FIG. 4, the resistance of the magnetoresistive element 2 varies with the intensity of a magnetic field applied to the magnetoresistive element 2. In the range of the magnetic field equal to and stronger than given values denoted by the dot-dash circles in FIG. 4, the resistance of the magnetoresistive element 2 decreases at extremely small rates as the absolute value of the magnetic field increases, and namely the resistance of the magnetoresistive element 2 remains essentially constant independent of the magnetic field. The given values of the magnetic field are referred to as saturation magnetic fields. In general, ferromagnetic magnetoresistive elements made of other materials have similar saturation characteristics.

As described previously, the magnetic field applied to the magnetoresistive element 2 by the permanent magnet 3 is equal to or greater than the saturation magnetic field, so that the degree of the decrease in resistance of the magnetoresistive element 2 by the application of the magnetic field can be essentially independent of some variations in the distance between the permanent magnet 3 and the magnetoresistive element 2 and independent of some variations in the magnetic field. Accordingly, the characteristics of the output potential Vout can be essentially independent of some error in position of the permanent magnet 3 and independent of some error in magnetization of the permanent magnet 3.

A widely-used nonferromagnetic magnetoresistive element made of indium antimonide (InSb) has characteristics considerably different from those of ferromagnetic magnetoresistive elements As shown by the broken curve in FIG. 4, the resistance of the InSb magnetoresistive element increases as the intensity of an applied magnetic field Accordingly, in a conventional noncontact potentiometer using an InSb magnetoresistive element, its output characteristics sensitively depend on the distance between the magnetoresistive element and a permanent magnet and on the magnetization of the permanent magnet.

As understood from the previous description, the first embodiment of this invention allows a high yield in manufacture of potentiometers. In addition, the potentiometer according to the first embodiment of this invention has acceptable linearity.

Figure 5:
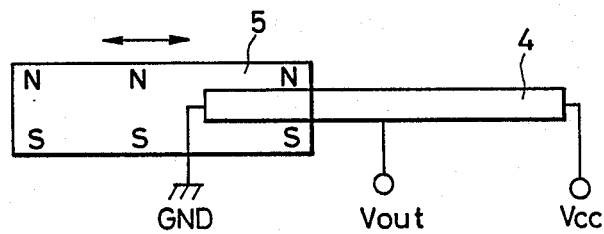
FIG. 5 is a diagram of a noncontact potentiometer according to a first modification of the first embodiment.
Figure 6:
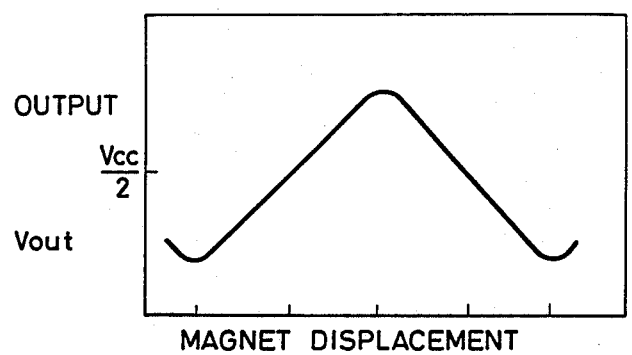
FIG. 6 is a graph showing the relationship between the output potential and the position of the permanent magnet in the potentiometer of FIG. 5.

FIG. 5 shows a first modification of the first embodiment of this invention. As shown in FIG. 5, the first modification includes a ferromagentic magnetoresistive element 4 in the form of a strip. A rectangular permanent magnet 5 extends parallel to the magnetoresitive strip 4. The permanent magnet 5 is movable in the longitudinal direction with respect to the magnetoresistive strip 4. As shown in FIG. 6, the output potential Vout varies linearly with the position of the permanent magnet 5. It should be noted that the permanent magnet 5 may be replaced by an electromagnet.

Figure 7:
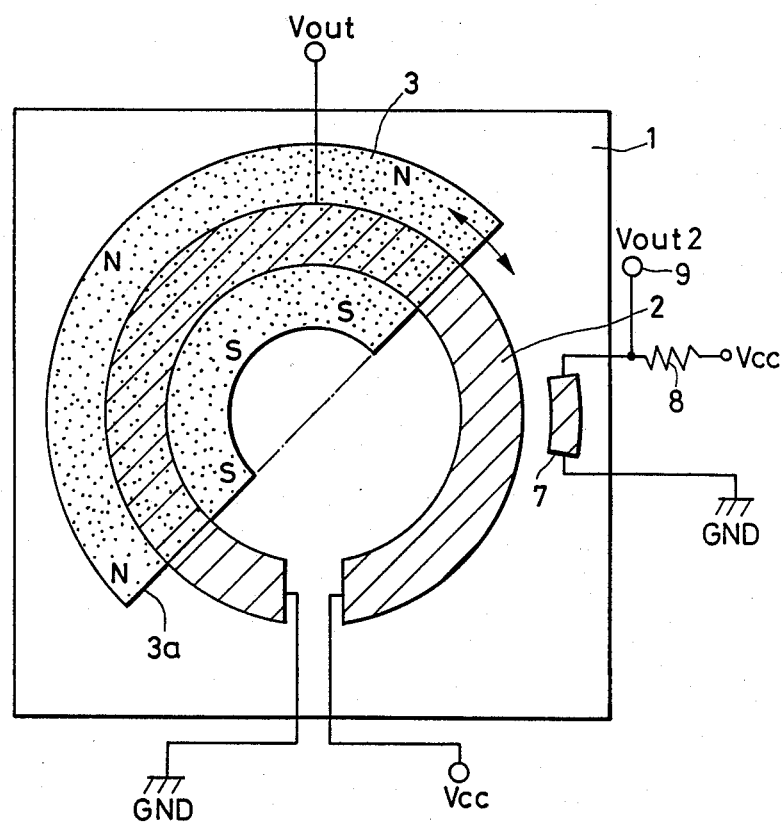
FIG. 7 is a top view of a noncontact potentiometer according to a second modification of the first embodiment.

FIG. 7 shows a second modification of the first embodiment of this invention. As shown in FIG. 7, the second embodiment includes a second ferromagnetic magnetoresistive element 7 fixedly extending on the area of the base plate 1 outward of the first magnetoresistive element 2. A first end of the magnetoresistive element 7 is electrically connected to the positive terminal of the constant voltage source via a fixed resistor 8. A second end of the magnetoresistive element 7 is electrically connected to the negative terminal of the constant voltage source via the ground. The junction between the magnetoresistive element 7 and the fixed resistor 8 is electrically connected to an output terminal 9. The second magnetoresistive element 7 is arranged so that the potential Vout2 at the output terminal 9 starts to vary when the rotational angle of the permanent magnet 3 increases to about 90°. Since the output potential Vout2 depends on the position of the permanent magnet 3, the output potential Vout2 represents the position of the permanent magnet 3. It should be noted that the first magnetoresistive element 2 may be omitted from the modification of FIG. 7.

DESCRIPTION OF THE SECOND PREFERRED EMBODIMENT

Figure 8:
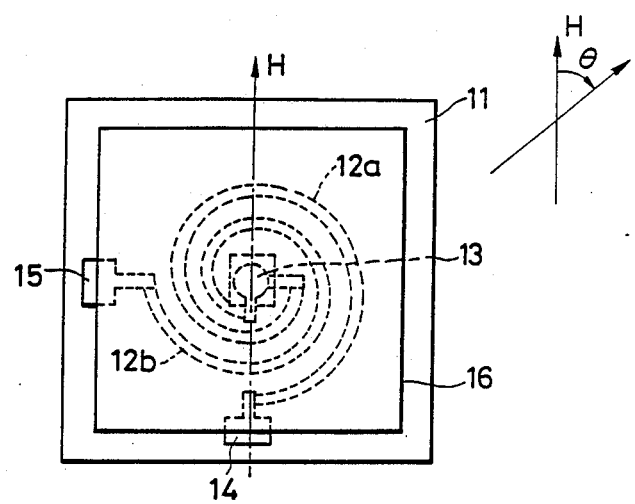
FIG. 8 is a top view of a substrate, magnetoresistive elements, and electrodes of a noncontact potentiometer according to a second embodiment of this invention.
Figure 9:
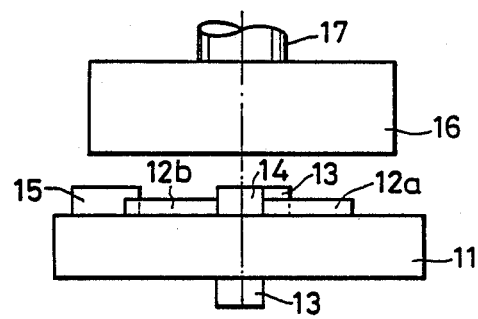
FIG. 9 is a side view of the base plate and the permanent magnet of the noncontact potentiometer according to the second embodiment.
Figure 10:
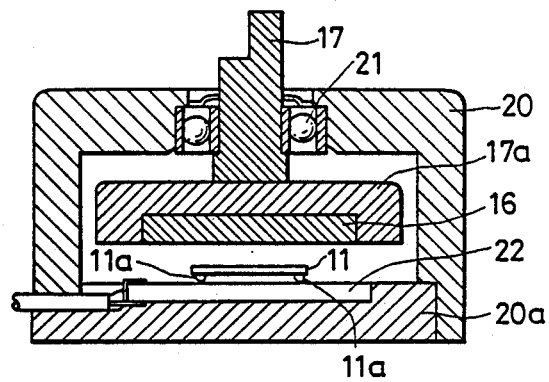
FIG. 10 is a sectional view of the noncontact potentiometer according to the second embodiment.

With reference to FIGS. 8-10, a noncontact potentiometer according to a second embodiment of this invention includes a substrate or base plate 11 made of insulating material. First and second ferromagnetic magnetoresistive elements 12a and 12b are formed on an upper surface of the substrate 11. The magnetoresistive elements 12a and 12b extend spirally from a central common 20 electrode 13 to outer electrodes 14 and 15 respectively. The magnetoresistive elements 12a and 12b have uniform or constant widths respectively. The position of the connection between the central electrode 13 and the second magnetoresistive element 12b is in 90° advance of the position of the connection between the central electrode 13 and the first magnetoresistive element 12a in the clockwise direction. Similarly, the position of the outer electrode 15 to which the second magnetoresistive element 12b is connected is in 90° advance of the position of the outer electrode 14 to which the first magnetoresistive element 12a is connected.

The outer electrode 14 is electrically connected to the positive terminal of a constant voltage source (not shown). The outer electrode 15 is electrically connected to the negative terminal of the constant voltage source via the ground. Accordingly, a constant electric current flows through the series combination of the magnetoresistive elements 12a and 12b. The central electrode 13 forms an output terminal.

A rectangular permanent magnet 16 extending parallel to the substrate 11 is separated from the magnetoresistive elements 12a and 12b by a given gap. The magnet 16 applies a magnetic field to the magnetoresistive elements 12a and 12b. As shown in FIG. 8, the direction H of the applied magnetic field is parallel to the plane of the substrate 11.

A rotatable control shaft 17 is fixed to a central portion of the magnet 16. The magnet 16 rotates together with the shaft 17. As the magnet 16 rotates in accordance with rotation of the shaft 17, the direction of the magnetic field applied to the magnetoresistive elements 12a and 12b rotates on the plane of the substrate 11. It should be noted that the magnet 16 may be in the form of a disc.

The substrate 11 and the magnet 16 are disposed within a casing 20. The shaft 17 extends into the casing 20. The shaft 17 is rotatably supported on the casing 20 via a bearing 21. The end of the shaft 17 residing in the casing 20 is formed with an attachment member 17a. The magnet 16 is fixed to the attachment member 17a by means of adhesive or others. Accordingly, the magnet 16 rotates together with the shaft 17. The insulating substrate 11 is supported on a wiring board 22 fixed to an inner surface of a bottom wall 20a of the casing 20. The insulating substrate 11 and the wiring board 22 are electrically connected via solders 11a. It should be noted that since the magnetoresistive elements 12a and 12b are extremely thin, the magnetoresistive elements 12a and 12b can not be shown in FIG. 10.

Figure 11:
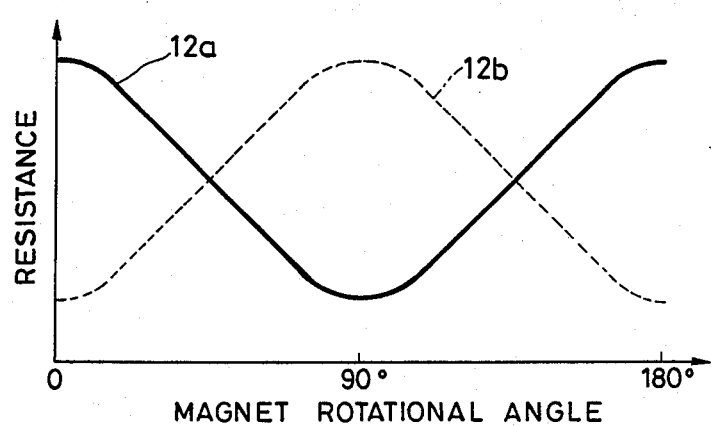
FIG. 11 is a graph showing the relationship between the resistances of the magnetoresistive elements and the rotational angle of the permanent magnet in the noncontact potentiometer of FIG. 10.

The portions of the magnetoresistive elements 12a and 12b where the directions of the electric currents are perpendicular to the applied magnetic field have most reduced resistances. As the magnet 16 rotates and thus the direction of the magnetic field applied to the magnetoresistive elements 12a and 12b rotates, the resistance reduced portions of the magnetoresistive elements 12a and 12b move. Accordingly, the total resistance of the first magnetoresistive element 12a and the total resistance of the second magnetoresistive element 12b vary with the rotational angle of the magnet 16 as shown in FIG. 11. The potential Vout at the output terminal 13 also varies with the rotational angle of the magnet 16.

The intensity of the magnetic field applied to the magnetoresistive elements 12a and 12b is chosen to be equal to or greater than a saturation magnetic field with respect to the magnetoresistive elements 12a and 12b as in the embodiment of FIGS. 1 and 2. Accordingly, the second embodiment of this invention has advantages similar to those of the embodiment of FIGS. 1 and 2.

The spiral shapes of the magnetoresistive elements 12a and 12b allow large resistances of the magnetoresistive elements 12a and 12b. The large resistances of the magnetoresistive elements 12a and 12b are advantageous in optimizing potentiometer output characteristics.

The central electrode 13 may be located on the lower surface of the substrate 11 opposite the magnet 16 to reliably prevent the central electrode 13 from interfering with the movement of the magnet 16. In this case, the magnetoresistive elements 12a and 12b are connected to the central electrode 13 via through holes formed in the substrate 11.

Figure 12:
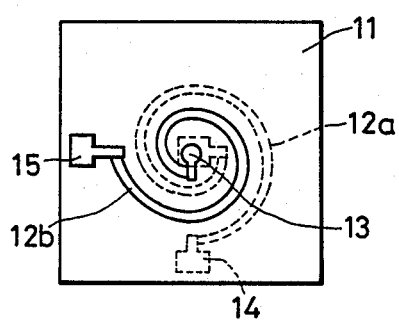
FIG. 12 is a top view of a base plate, magnetoresistive elements, and electrodes of a noncontact potentiometer according to a first modification of the second embodiment.
Figure 13:
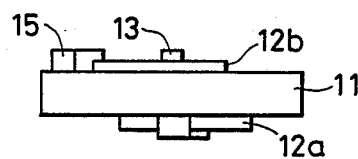
FIG. 13 is a side view of the base plate, the magnetoresistive elements, and the electrodes of the noncontact of FIG. 12.

FIGS. 12 and 13 show a first modification of the second embodiment of this invention. As shown in FIGS. 12 and 13, in the first modification, magnetoresistive elements 12a and 12b are located on the opposite surfaces of the substrate 11 respectively. The central electrode 13 extends through the substrate 11.

Figure 14:
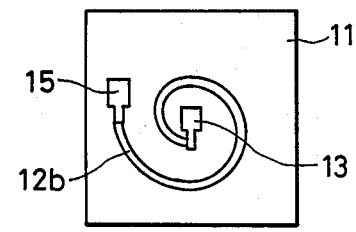
FIG. 14 is a top view of a base plate, a magnetoresistive element, and electrodes of a noncontact potentiometer according to a second modification of the second embodiment.
Figure 15:
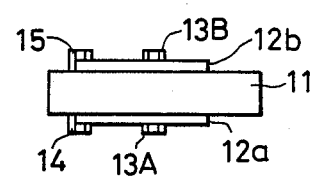
FIG. 15 is a side view of the base plate, the magnetoresistive elements, and the electrodes of the noncontact potentiometer of FIG. 14.
Figure 16:
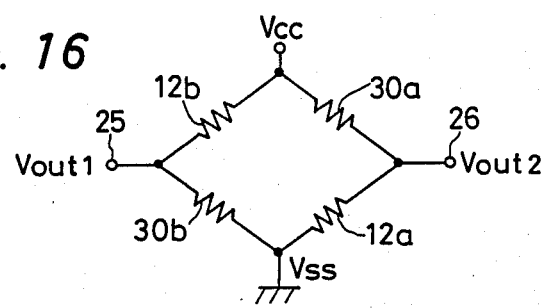
FIG. 16 is a schematic diagram of the noncontact potentiometer of FIGS. 14 and 15.

FIGS. 14 and 15 show a second modification of the second embodiment of this invention. As shown in FIGS. 14 and 15, in the second modification, magnetoresistive elements 12a and 12b are located on the opposite surfaces of the substrate 11 respectively. The inner ends of the magnetoresistive elements 12a and 12b are electrically connected to central electrodes 13A and 13B fixed on the opposite surfaces of the substrate 11 respectively. The central electrodes 13A and 13B are electrically isolated. The first and second magnetoresisitve elements 12a and 12b have similar shapes. This design of the magnetoresistive elements 12a and 12b allows the substrate 11 to be smaller. In the second modification, as shown in FIG. 16, one end of the magnetoresistive element 12b is electrically connected to the positive terminal of the constant voltage source. The other end of the magnetoresistive element 12b is electrically connected to a first output terminal 25. One end of the magnetoresistive element 12a is electrically connected to a second output terminal 26. The other end of the magnetoresistive element 12a is electrically connected to the negative terminal of the constant voltage source via the ground. A fixed resistor 30a is connected between the second output terminal 26 and the positive terminal of the constant voltage source. Another fixed resistor 30b is connected between the first output terminal 25 and the ground. In this way, the magnetoresistive elements 12a and 12b, and the fixed resistors 25 and 26 form a bridge circuit. A potential Vout1 at the first output terminal 25 and a potential Vout2 at the second output terminal 26 vary with the rotational angle of the magnet.

DESCRIPTION OF THE THIRD PREFERRED EMBODIMENT

Figure 17:
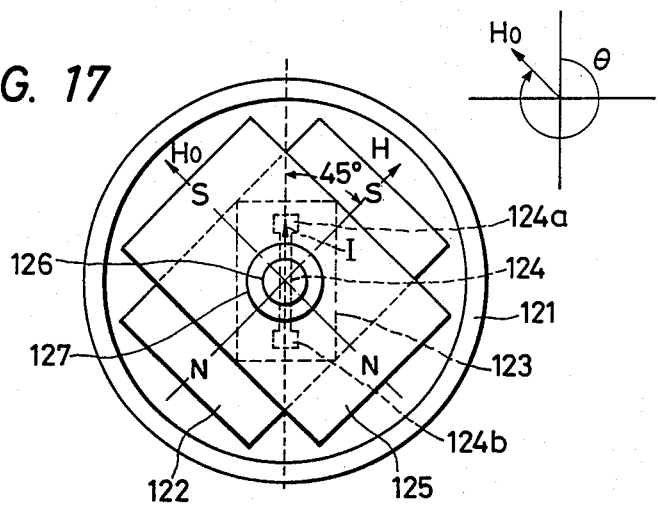
FIG. 17 is a plan view of a portion of a noncontact potentiometer according to a third embodiment of this invention.
Figure 18:
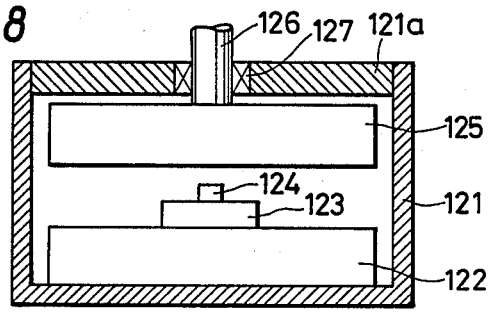
FIG. 18 is a sectional view of the noncontact potentiometer of FIG. 17.

With reference to FIGS. 17 and 18, a casing 121 made of magnetically shielding material has a lower inner surface to which a bias magnet 122 is fixed by means of adhesive or others. A substrate or base plate 123 made of insulating material is fixedly mounted on the bias magnet 122. A ferromagnetic magnetoresistive element 124 fixedly extends on the base plate 123. A longitudinal direction of the magnetoresistive element 124 is oblique at an angle of 45° with respect to the direction of magnetic field applied to the magnetoresistive element 124 by the bias magnet 122. The surface of the bias magnet 122 corresponding to the magnetoresistive element 124 has a magnetic flux density of 40 mT.

Opposite ends of the magnetoresistive element 124 are formed with electrodes 124a and 124b respectively. An electric current I flows between the electrodes 124a and 124b in the longitudinal direction of the magnetoresistive element 124. A control shaft 126 is rotatably supported on an upper end wall 121a of the casing 121 via a bearing 127. A rectangular magnet 125 is fixed to the shaft 126 so that the rectangular magnet 125 rotates together with the shaft 126. The surface of the rectangular magnet 122 corresponding to the magnetoresistive element 124 has a magnetic flux density of 40 mT.

The resultant magnetic field G applied to the magnetoresistive element 124 equals a vector sum of the magnetic field H generated by the bias magnet 122 and the magnetic field Ho generated by the rectangular magnet 125. Accordingly, the resultant magnetic field G applied to the magnetoresistive element 124 varies with rotation of the rectangular magnet 125.

Figure 19:
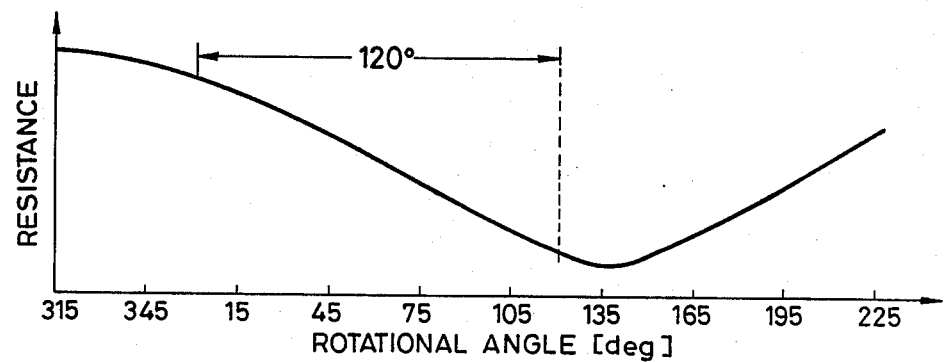
FIG. 19 is a graph showing the relationship between the resistance of the magnetoresistive element and the rotational angle of the rectangular magnet in the noncontact potentiometer of FIGS. 17 and 18.

As shown in FIG. 19, the resistance of the magnetoresistive element 124 varies with rotational angle of the rectangular magnet 125.

The resistance of the magnetoresistive element 124 is maximized when the direction of the electric current flowing through the element 124 is parallel to the direction of the magnetic field applied to the element 124. The resistance of the magnetoresistive element 124 is minimized when the direction of the electric current flowing through the element 124 is perpendicular to the direction of the magnetic field applied to the element 124. Specifically, the resistance of the magnetoresistive element 124 is maximized when the direction of the resultant magnetic field G is parallel to the direction of the electric current I, that is, when the rotational angle of the rectangular magnet 125 equals 315°. The resistance of the magnetoresistive element 124 is minimized when the direction of the resultant magnetic field G is perpendicular to the direction of the electric current I, that is, when the rotational angle of the rectangular magnet 125 equals 135°.

As shown in FIG. 19, the resistance of the magnetoresistive element 124 varies linearly with the rotational angle of the rectangular magnet 125 in a range corresponding to 120°. This linear range is acceptably wide.

It is preferable that the magnetoresistive element 124 is made of material similar to the material of the magnetoresistive element in the embodiment of FIGS. 1 and 2. In addition, the resultant magnetic field applied to the magentoresistive element 124 is preferably equal to or stronger than a saturation magnetic field with respect to the magnetoresistive element 124. In this case, the third embodiment of this invention has advantages similar to the advantages of the embodiment of FIGS. 1 and 2.

Figure 20:
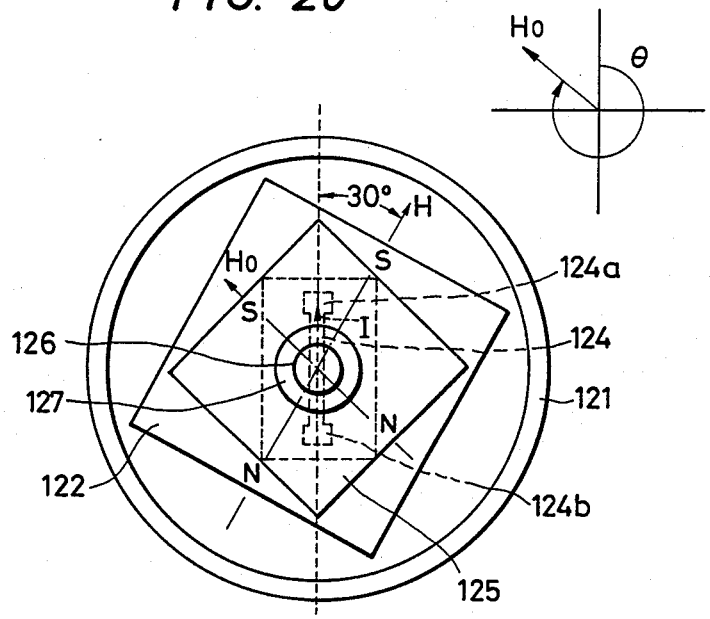
FIG. 20 is a plan view of a portion of a noncontact potentiometer according to a modification of the third embodiment.
Figure 21:
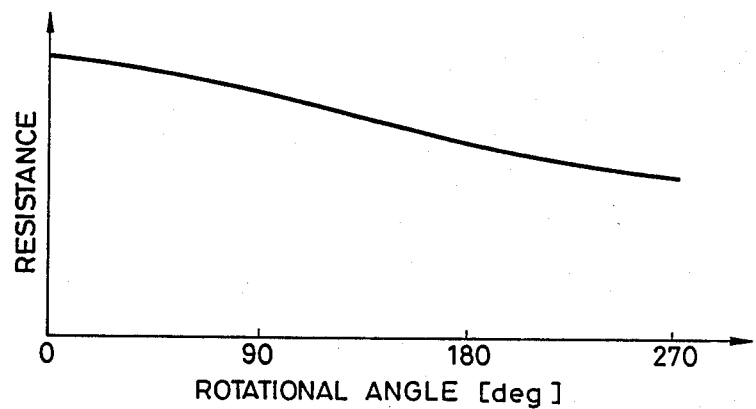
FIG. 21 is a graph showing the relationship between the resistance of the magnetoresistive element and the rotational angle of the rectangular magnet in the noncontact potentiometer of FIG. 20.

FIG. 20 shows a modification of the third embodiment of this invention. As shown in FIG. 20, in this modification, the longitudinal direction of the magnetoresistive element 124 is oblique at an angle of 30° with respect to the direction of magnetic field applied to the magnetoresistive element 124 by the bias magnet 122. The surface of the bias magnet 122 corresponding to the magnetoresistive element 124 has a magnetic flux density of 40 mT. The surface of the rectangular magnet 122 corresponding to the magnetoresistive element 124 has a magnetic flux density of 20 mT. In this modification, as shown in FIG. 21, the resistance of the magnetoresistive element 124 varies linearly with the rotational angle of the rectangular magnet 125 in a wide range.

DESCRIPTION OF THE FOURTH PREFERRED EMBODIMENT

Figure 22:
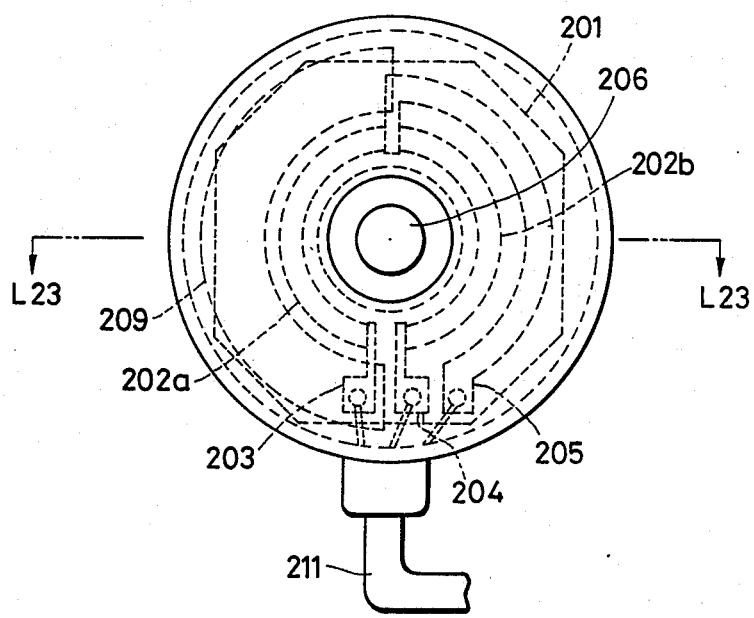
FIG. 22 is a top view of a noncontact potentiometer according to a fourth embodiment of this invention.
Figure 23:
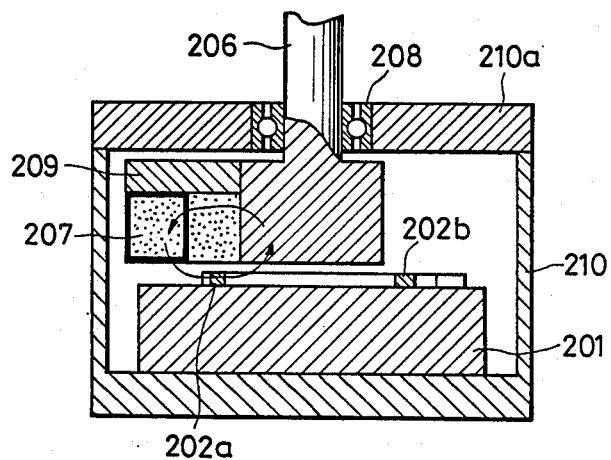
FIG. 23 is a sectional view taken along the line L23—L23 of FIG. 22.

With reference to FIGS. 22 and 23, a noncontact potentiometer according to a fourth embodiment of this invention includes a substrate or base plate 201 made of insulating material. Approximately semicircular or semicircumferential ferromagnetic magnetoresistive elements 202a and 202b fixedly extend on an upper surface of the substrate 201. The width of each of the magnetoresistive elements 202a and 202b is greater than the thickness of each of the magnetoresistive elements 202a and 202b. In other words, the radial dimension of each of the magnetoresistive elements 202a and 202b is greater than the axial dimension of each of the magnetoresistive elements 202a and 202b. The magnetoresistive elements 202a and 202b are made of material similar to the material of the magnetoresistive elements in the embodiment of FIGS. 1 and 2. The magnetoresistive elements 202a and 202b are opposed to each other so that the magnetoresistive element 202a and 202b form a circle or ring having an opening.

Opposite ends of the magnetoresistive element 202a are electrically connected to electrodes 203 and 205 respectively. Opposite ends of the magnetoresistive element 202b are electrically connected to an electrode 204 and the electrode 205 respectively. The electrode 203 is connected to the negative terminal of a constant voltage source (not shown) via the ground. The electrode 204 is connected to the positive terminal of the constant voltage source. The common electrode 205 forms an output terminal. A wire harness 211 is electrically connected to the electrodes 203-205.

A casing 210 accommodating the substrate 201 has an upper end wall 210a. The upper end wall 210a supports a bearing 208 coaxial with a circular pattern of the magnetoresistive elements 202a and 202b. A control shaft 206 made of magnetic material is rotatably supported on the upper end wall 210a via the bearing 208. The control shaft 206 extends vertically as viewed in FIG. 23. A semicircular permanent magnet 207 is coaxially fixed to the shaft 206 via an attachment plate 209 made of magnetic material. The permanent magnet 207 rotates together with the shaft 206 about the axis of the circular pattern of the magnetoresistive elements 202a and 202b. The permanent magnet 207 is magnetized along the axis of the shaft 206, that is, in the direction perpendicular to the radial direction with respect to the permanent magnet 207. The permanent magnet 207 opposes a portion of the combination of the magnetoresistive elements 202a and 202b.

The magnetic field applied to the magnetoresistive elements 202a and 202b by the permanent magnet 207 is chosen to be equal to or stronger than a saturation magnetic field with respect to the magnetoresistive elements 202a and 202b as in the embodiment of FIGS. 1 and 2. Accordingly, the fourth embodiment has advantages similar to the advantages of the embodiment of FIGS. 1 and 2.

As described previously, the permanent magnet 207 is magnetized in the direction parallel to the axis of the shaft 206. This magnetization of the permanent magnet 207 can be easily performed. The direction of the magnetic field applied to the magnetoresistive elements 202a and 202b by the permanent magnet 207 extends radially with respect to the circular pattern of the magnetoresistive elements 202a and 202b.

The output characteristics of the potentiometer in the fourth embodiment of this invention are similar to those of the potentiometer in the embodiment of FIGS. 1 and 2.

It should be noted that the magnetoresistive elements 202a and 202b may be of polygonal shapes, strip shapes, linear shapes, or other shapes. In cases where the magnetoresistive elements 202a and 202b are linear, the permanent magnet 207 may be linear correspondingly and be movable linearly to detect linear displacement. In addition, the combination of the permanent magnet 207 and the magnetoresistive elements 202a and 202b may be designed so that the permanent magnet 207 can move linearly and also can rotate relative to the magnetoresistive elements 202a and 202b. In this case, linear displacement and also rotational displacement can be detected.

Figure 24:
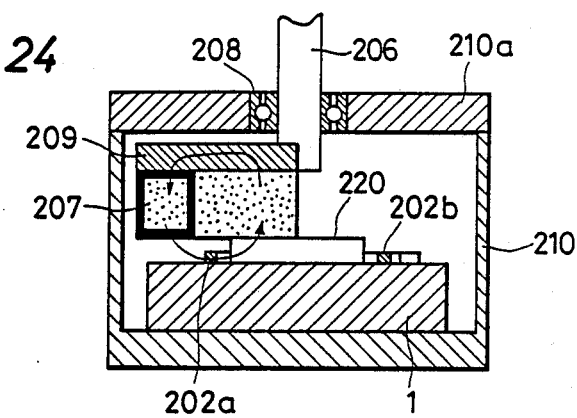
FIG. 24 is a sectional view of a noncontact potentiometer according to a first modification of the fourth embodiment.

FIG. 24 shows a first modification of the fourth embodiment of this invention. As shown in FIG. 24, in the first modification, a disc 220 made of magnetic material is coaxially located within the circular pattern of the magnetoresistive elements 202a and 202b. The magnetic disc 220 guides the magnetic flux so that the magnetic flux can effectively pass through the magnetoresistive elements 202a and 202b.

Figure 25:
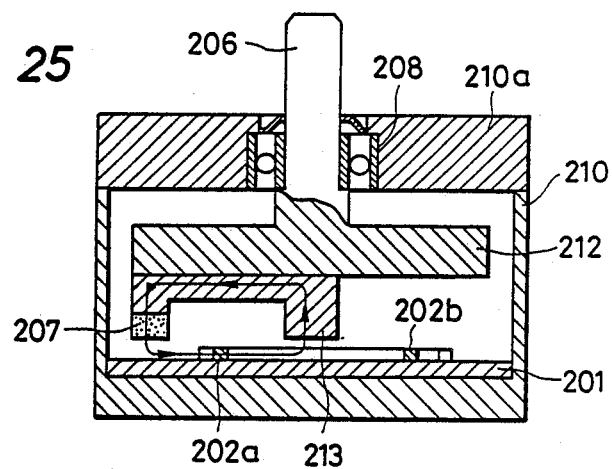
FIG. 25 is a sectional view of a noncontact potentiometer according to a second modification of the fourth embodiment.

FIG. 25 shows a second modification of the fourth embodiment of this invention. As shown in FIG. 25, in the second modification, a circular rotor 212 is fixed coaxially to the shaft 206. A semicircular yoke 213 made of magnetic material is coaxially fixed to a lower surface of the rotor 212. The permanent magnet 207 is fixed to a circular edge of the yoke 213 by means of adhesive or others. The yoke 213 has a projection extending toward the substrate 201 and coaxially with respect to the shaft 206. The yoke 213 guides the magnetic flux so that the magnetic flux can effectively pass through the magnetoresitive elements 202a and 202b.

Figure 26:
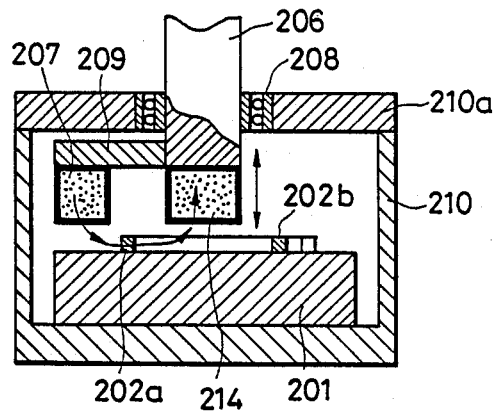
FIG. 26 is a sectional view of a noncontact potentiometer according to a third modification of the fourth embodiment.

FIG. 26 shows a third modification of the fourth embodiment of this invention. As shown in FIG. 26, in the third modification, a second permanent magnet 214 is coaxially fixed to the shaft 206 by means of adhesive or others. The direction of magnetization of the second permanent magnet 214 extends axially with respect to the shaft 206. Furthermore, the direction of magnetization of the second permanent magnet 214 is opposite to the direction of magnetization of the first permanent magnet 207. The second permanent magnet 214 increases the magnetic flux passing through the magnetoresistive elements 202a and 202b, so that the potentiometer output variations are enhanced.

DESCRIPTION OF THE FIFTH PREFERRED EMBODIMENT

Figure 27:
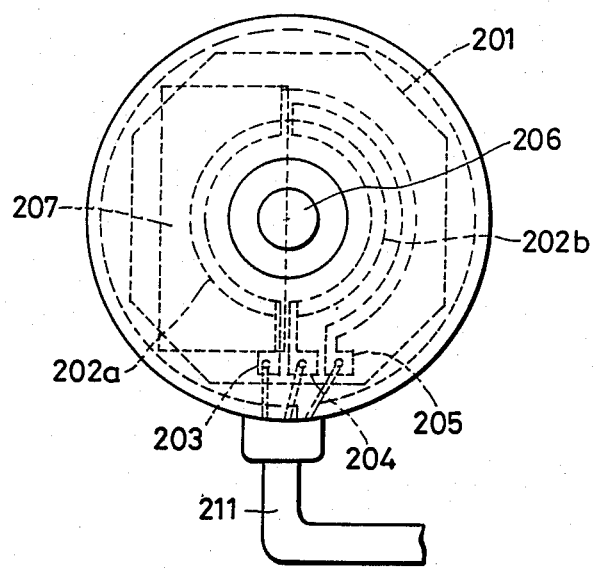
FIG. 27 is a top view of a noncontact potentiometer according to a fifth embodiment of this invention.
Figure 28:
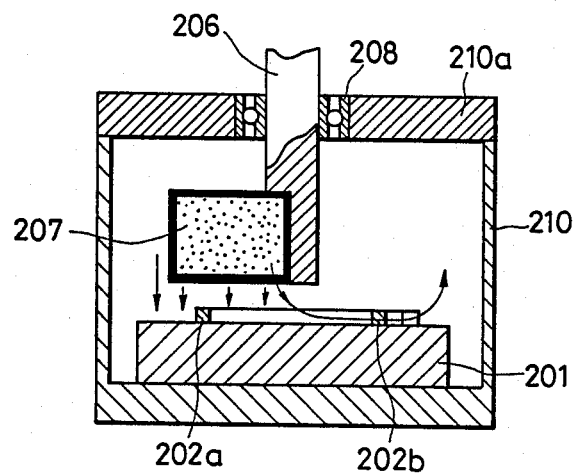
FIG. 28 is a sectional view of the noncontact potentiometer of FIG. 27.

FIGS. 27 and 28 show a noncontact potentiometer according to a fifth embodiment of this invention, which is similar to the embodiment of FIGS. 22 and 23 except for design changes described hereinafter.

As shown in FIGS. 27 and 28, in the fifth embodiment, a rectangular permanent magnet 207 is directly fixed to the shaft 206. The permanent magnet 207 extends in one side of the shaft 206. The magnetization of the permanent magnet 207 extends in the axial direction with respect to the shaft 206. This magnetization can be easily performed.

When the permanent magnet 207 is in a position where the permanent magnet 207 extends directly above the magnetoresistive element 202a as shown in FIGS. 27 and 28, the magnetic field applied to the magnetoresistive element 202a by the permanent magnet 207 extends axially with respect to a circular pattern of the magnetoresistive elements 202a and 202b and the magnetic field applied to the magnetoresistive element 202b by the permanent magnet 207 extends radially with respect to the circular pattern of the magnetoresistive elements 202a and 202b.

Figure 29:
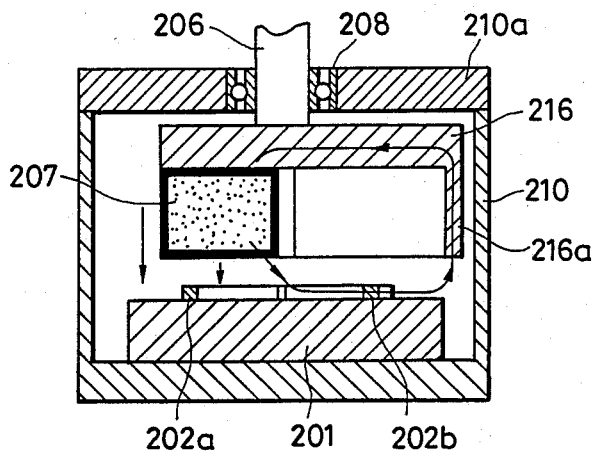
FIG. 29 is a sectional view of a noncontact potentiometer according to a first modification of the fifth embodiment.

FIG. 29 shows a first modification of the fifth embodiment of this invention. As shown in FIG. 29, in the first modification, a yoke 216 made of magnetic material is fixed to the shaft 206. The permanent magnet 207 is fixed to a lower surface of the yoke 216 by means of adhesive or others. The yoke 216 has a downward projection 216a extending in a side of the shaft 206 opposite the side of the shaft 206 where the permanent magnet 207 extends. The projection 216a of the yoke 216 extends outside the circular pattern of the magnetoresistive elements 202a and 202b. The yoke 216 guides the magnetic flux so that the magnetic flux can effectively pass through the magnetoresistive elements 202a and 202b. Accordingly, the potentiometer output variations can be enhanced.

Figure 30:
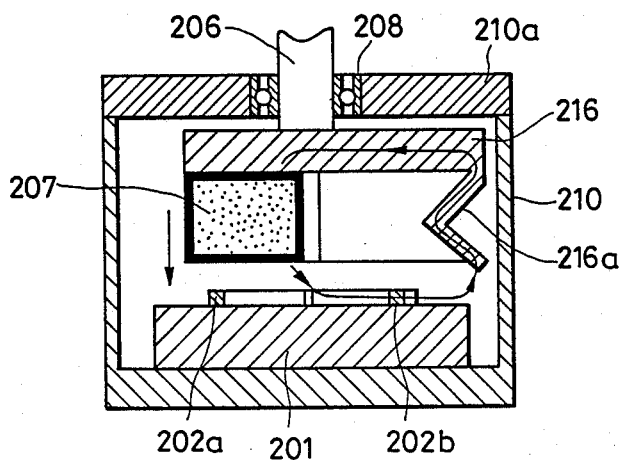
FIG. 30 is a sectional view of a noncontact potentiometer according to a second modification of the fifth embodiment.

FIG. 30 shows a second modification of the fifth embodiment of this invention. The second modification is similar to the modification of FIG. 29 except that the projection 216a of the yoke 216 is of a V-shaped section.

Figure 31:
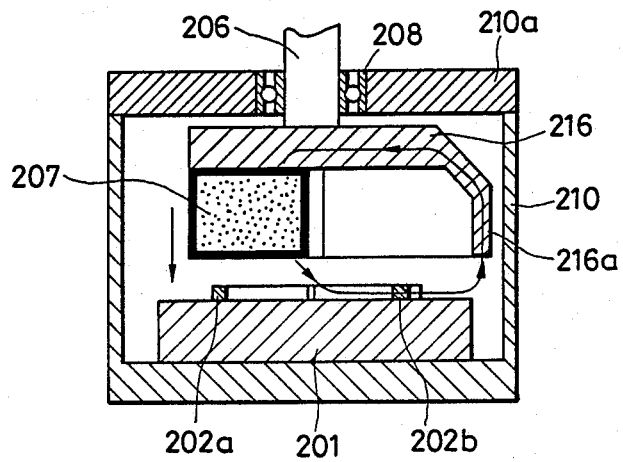
FIG. 31 is a sectional view of a noncontact potentiometer according to a third modification of the fifth embodiment.

FIG. 31 shows a third modification of the fifth embodiment of this invention. The third modification is similar to the modification of FIG. 29 except that the projection 216a of the yoke 216 is beveled.

Figure 32:
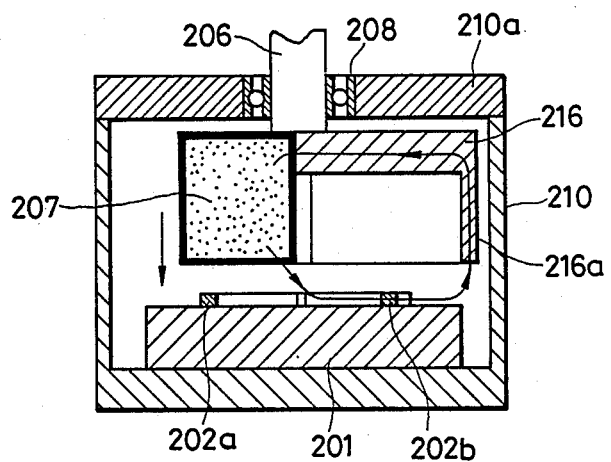
FIG. 32 is a sectional view of a noncontact potentiometer according to a fourth modification of the fifth embodiment.

FIG. 32 shows a fourth modification of the fifth embodiment of this invention. The fourth modification is similar to the modification of FIG. 29 except that the yoke 216 extends in a side of the shaft 206 opposite the side of the shaft 206 where the permanent magnet 207 extends, and that the permanent magnet 207 is directly fixed to the shaft 206.

DESCRIPTION OF THE SIXTH PREFERRED EMBODIMENT

Figure 33:
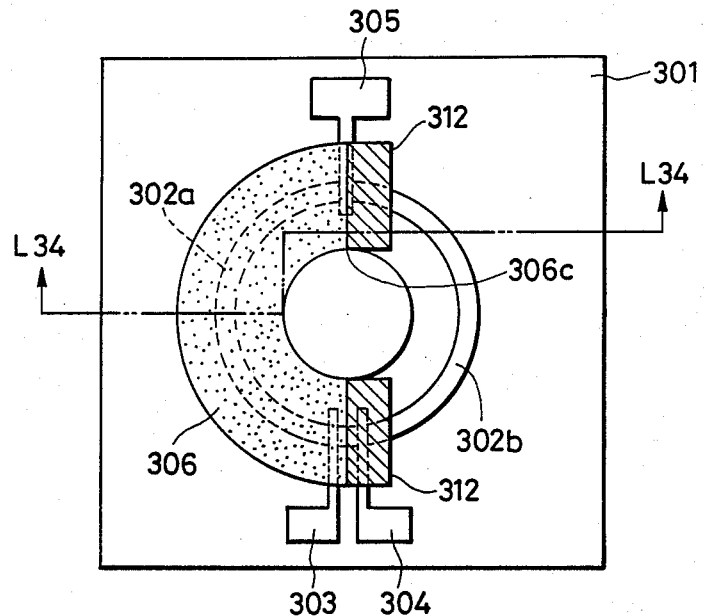
FIG. 33 is a horizontally section view of a noncontact potentiometer according to a sixth embodiment of this invention.
Figure 34:
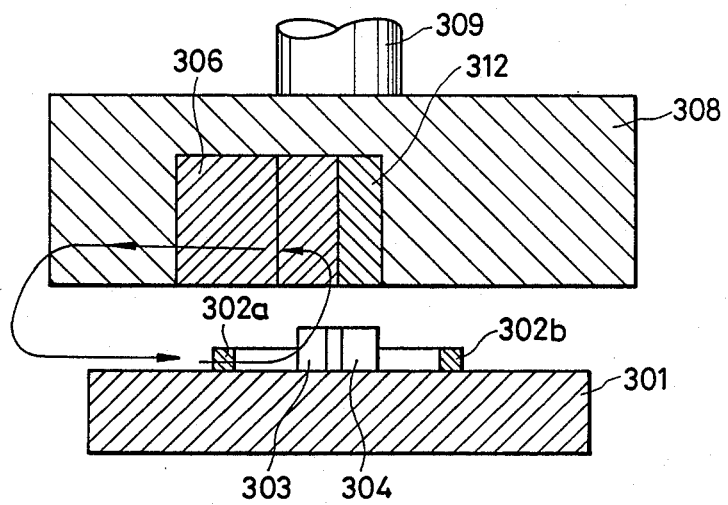
FIG. 34 is a sectional view taken along the line L34—L34 of FIG. 33.
Figure 35:
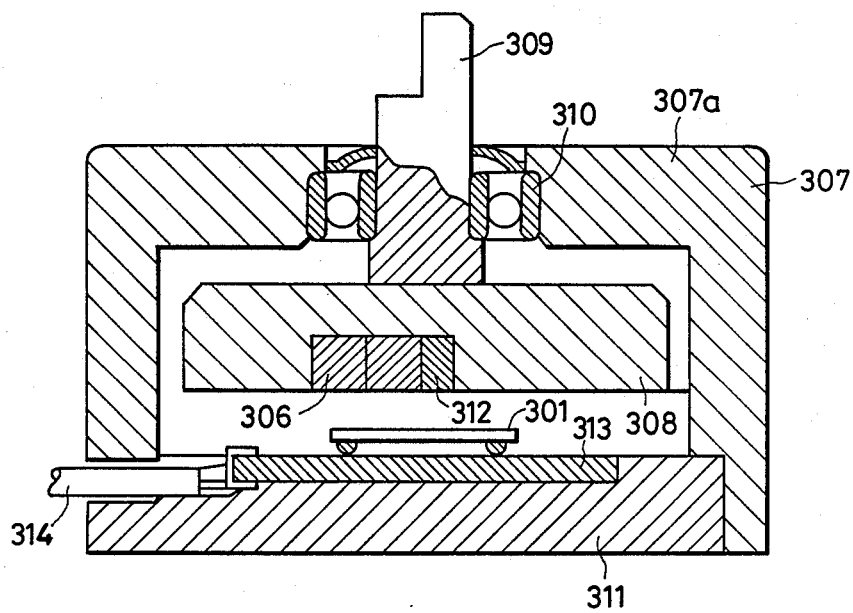
FIG. 35 is a sectional view of the noncontact potentiometer of FIGS. 33 and 34.

With reference to FIGS. 33–35, a noncontact potentiometer according to a sixth embodiment of this invention includes a substrate or base plate 301 made of insulating material. Semicircular ferromagnetic magnetoresistive elements 302a and 302b fixedly extend on an upper surface of the substrate 301. The magnetoresistive elements 302a and 302b are made of material similar to the material of the magnetoresistive elements in the embodiment of FIGS. 1 and 2. The magnetoresistive elements 302a and 302b are opposed to each other so that the magnetoresitive elements 302a and 302b form a circle or ring having an opening.

Opposite ends of the magnetoresistive element 302a are connected to electrodes 303 and 305 respectively. Opposite ends of the magnetoresistive element 302b are connected to an electrodes 304 and the electrode 305 respectively. The electrode 303 is connected to the positive terminal of a constant voltage source (not shown). The electrode 304 is connected to the negative terminal of the constant voltage source via the ground. The common electrode 305 forms an output terminal.

A cylindrical casing 307 accommodating the substrate 301 has an upper end wall 307a. The upper end wall 307a supports a bearing 310 coaxial with a circular pattern of the magnetoresistive elements 302a and 302b. A control shaft 309 is rotatably supported on the upper end wall 307a via the bearing 310. The control shaft 309 extends coaxially into the casing 307 in the vertical direction as viewed in FIGS. 34 and 35. A disc rotor 308 residing within the casing 307 is coaxially fixed to the shaft 309. The rotor 308 rotates together with the shaft 309. The rotor 308 can rotate about the axis of the circular pattern of the magnetoresistive elements 302a and 302b.

The substrate 301 is mounted on a wiring board 313 fixed to an inner surface of a lower end wall 311 of the casing 307. A wire harness 314 extends from the wiring board 313. The surface of the substrate 301 provided with the magnetoresistive elements 302a and 302b faces the rotor 308. A semicircular permanent magnet 306 fixed to the rotor 308 extends coaxially with respect to the circular pattern of the magnetoresistive elements 302a and 302b. The permanent magnet 306 rotates together with the rotor 308 about the axis of the circular pattern of the magnetoresistive elements 302a and 302b. The permanent magnet 306 faces the surface of the substrate 301 provided with the magnetoresistive elements 302a and 302b. The permanent magnet 306 is axially spaced from the magnetoresistive elements 302a and 302b by a given gap. A pair of magnetic shields 312 are fixed to ends of the permanent magnet 306 respectively by means of adhesive or others. The magnetic shields 312 are made of magnetic material, such as iron or ferrite. The permanent magnet 306 is magnetized so that the magnetic field generated by the permanent magnet 306 can pass radially through the magnetoresistive elements 302a and 302b as shown by the arrows in FIG. 34.

The magnetic field applied to the magnetoresistive elements 302a and 302b by the permanent magnet 306 is chosen to be equal to or stronger than a saturation magnetic field with respect to the magnetoresistive elements 302a and 302b as in the embodiment of FIGS. 1 and 2. Accordingly, the sixth embodiment has advantages similar to the advantages of the embodiment of FIGS. 1 and 2.

The output characteristics of the potentiometer in the sixth embodiment of this invention are basically similar to those of the potentiometer in the embodiment of FIGS. 1 and 2.

The magnetic shields 312 absorb the magnetic field or flux extending from the ends of the permanent magnet 306 which could adversely affect the potentiometer output characteristics. The action of the magnetic shields 312 allows more accurate and reliable potentiometer output characteristics. In addition, the action of the magnetic shields 312 increases the potentiometer output variations and widens the potentiometer linear variation range.

It should be noted that the magnetoresistive elements 302a and 302b may be of polygonal shapes, strip shapes, linear shapes, or other shapes. In cases where the magnetoresistive elements 302a and 302b are linear, the permanent magnet 306 may be linear correspondingly and be movable linearly to detect linear displacement. In addition, the combination of the permanent magnet 306 and the magnetoresistive elements 302a and 302b may be designed so that the permanent magnet 306 can move linearly and also can rotate relative to the magnetoresistive elements 302a and 302b. In this case, linear displacement and also rotational displacement can be detected.

Figure 36:
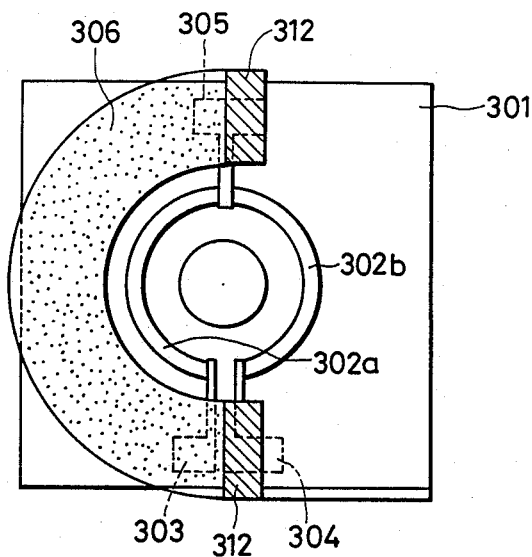
FIG. 36 is a horizontally section view of a noncontact potentiometer according to a first modification of the sixth embodiment.
Figure 37:
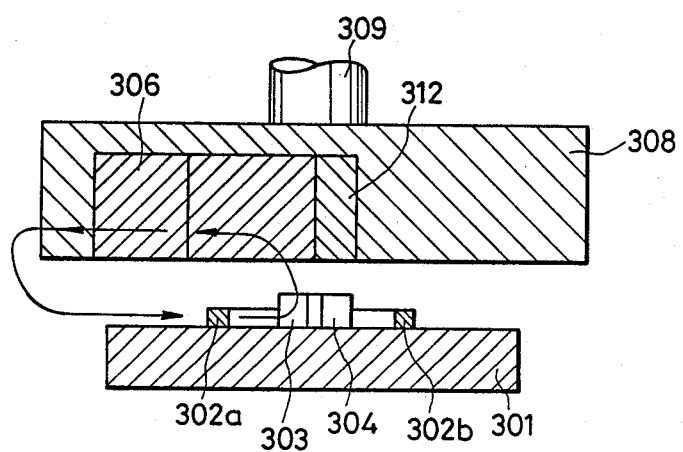
FIG. 37 is a vertically section view of the noncontact potentiometer of FIG. 36.

FIGS. 36 and 37 show a first modification of the sixth embodiment of this invention. As shown in FIGS. 36 and 37, in the first embodiment, a permanent magnet 306 has an inside diameter greater than the outside diameter of the circular pattern of the magnetoresistive elements 302a and 302b so that the permanent magnet 306 extends radially outward of the circular pattern of the magnetoresistive elements 302a and 302b.

Figure 38:
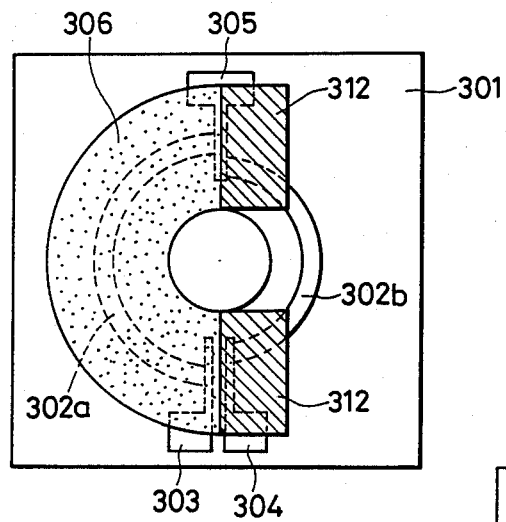
FIG. 38 is a horizontally section view of a noncontact potentiometer according to a second modification of the sixth embodiment.

FIG. 38 shows a second modification of the sixth embodiment of this invention. As shown in FIG. 38, in the second embodiment, a permanent magnet 306 has a width greater than the width of the permanent magnet of FIGS. 33 and 34. In addition, magnetic shields 312 are correspondingly larger than the magnetic shields of FIGS. 33 and 34. In the second embodiment, the radius of a magnetoresistive element 302a is somewhat greater than the radius of another magnetoresistive element 302b. The second modification enhances the effect of the magnetic shields 312.

Figure 39:
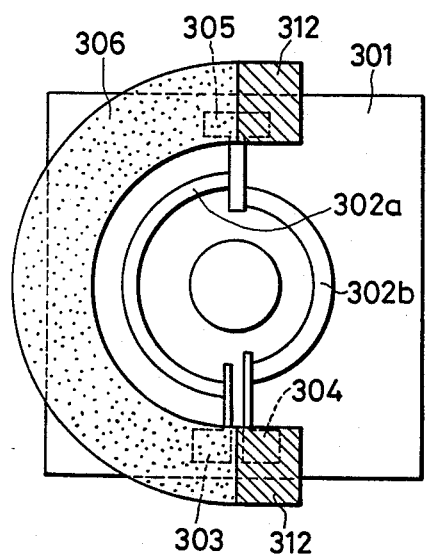
FIG. 39 is a horizontally section view of a noncontact potentiometer according to a third modification of the sixth embodiment.

FIG. 39 shows a third modification of the sixth embodiment of this invention, which is similar to the modification of FIG. 38 except that the permanent magnet 306 has a larger inside diameter and thus extends radially outward of the circular pattern of the magnetoresistive elements 302a and 302b.

Figure 40:
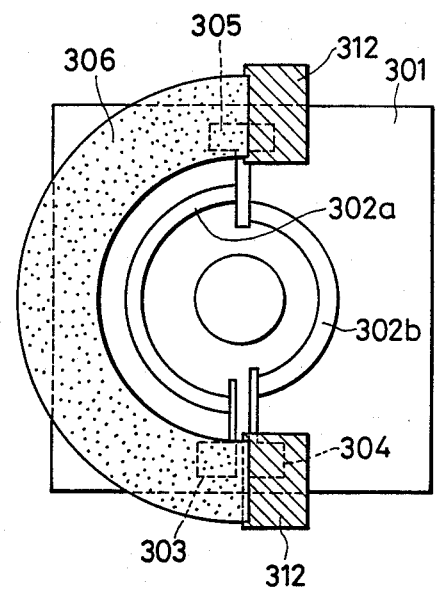
FIG. 40 is a horizontally section view of a noncontact potentiometer according to a fourth modification of the sixth embodiment.

FIG. 40 shows a fourth modification of the sixth embodiment of this invention, which is similar to the modification of FIG. 39 except that the magnetic shields 312 have recesses into which the ends of the permanent magnet 306 fit.

DESCRIPTION OF THE SEVENTH PREFERRED EMBODIMENT

Figure 41:
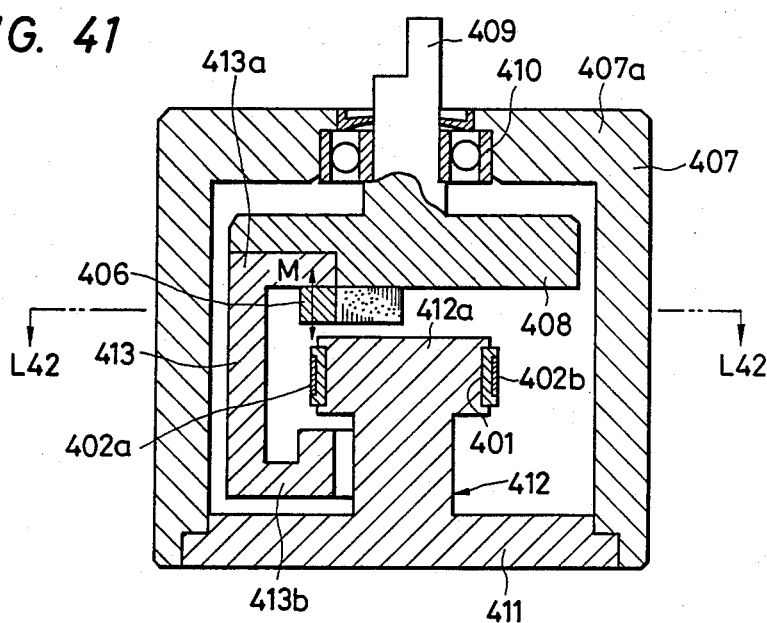
FIG. 41 is a longitudinal section view of a noncontact potentiometer according to a seventh embodiment of this invention.
Figure 42:
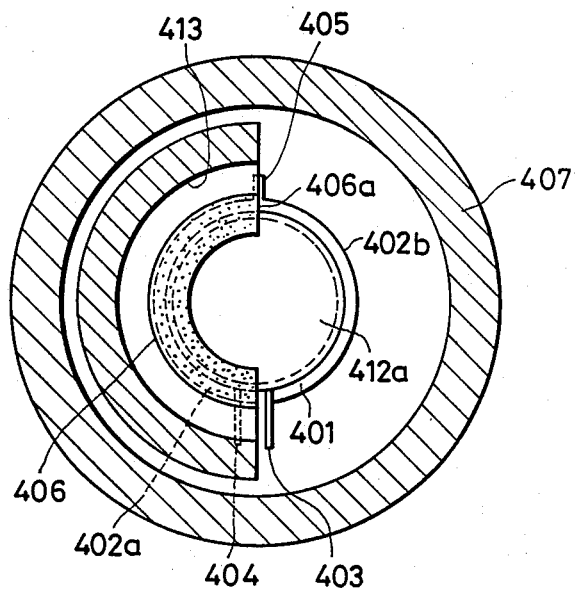
FIG. 42 is a sectional view taken along the line L42—L42 of FIG. 41.

With reference to FIGS. 41 and 42, a noncontact potentiometer according to a seventh embodiment of this invention includes a substrate or base plate 401 made of flexible insulating material. Semicircular ferromagnetic magnetoresistive elements 402a and 402b fixedly extend on the substrate 401. The magnetoresistive elements 402a and 402b are made of material similar to the material of the magnetoresistive elements in the embodiment of FIGS. 1 and 2. The magnetoresistive elements 402a and 402b are opposed to each other so that the magnetoresitive elements 402a and 402b form a circle or ring having an opening.

The circular configuration of the combination of the magnetoresistive elements 402a and 402b has an opening defined between opposing ends of the magnetoresistive elements 402a and 402b. These opposing ends of the magnetoresistive elements 402a and 402b are connected to electrodes 404 and 403 respectively. The other ends of the magnetoresistive elements 402a and 402b are connected in common to an electrode 405. The electrode 403 is connected to the positive terminal of a constant voltage source (not shown). The electrode 404 is connected to the negative terminal of the constant voltage source via the ground. The common electrode 405 forms an output terminal.

A cylindrical casing 407 accommodating the substrate 401 has an upper end wall 407a. The upper end wall 407a supports a bearing 410 coaxial with the circular configuration of the combination of the magnetoresistive elements 402a and 402b. A control shaft 409 is rotatably supported on the upper end wall 407a via the bearing 410. The control shaft 409 extends coaxially into the casing 407 in the vertical direction as viewed in FIG. 41. A disc rotor 408 residing within the casing 407 is coaxially fixed to the shaft 409. The rotor 408 rotates together with the shaft 409. The rotor 408 can rotate about the axis of the circular configuration of the combination of the magnetoresistive elements 402a and 402b.

The casing 407 has a lower end wall 411 having an integral cylindrical member 412 projecting into the casing 407 and coaxially with respect to the shaft 409. The cylindrical member 412 has a step, a larger diameter portion 412a above the step, and a smaller diameter portion below the step. The substrate 401 is attached to an circumferential outer surface of the larger diameter portion 412a of the cylindrical member 412.

The casing 407 accommodates a yoke 413 made of magnetic material and attached to a lower surface of the rotor 408. The yoke 413 has a vertical portion extending outward of the circular configuration of the combination of the magnetoresistive elements 402a and 402b. The yoke 413 has an upper projection 413a and a lower projection 413b extending radially inwardly from the vertical portion. As shown in FIG. 41, a portion of the combination of the magnetoresistive elements 402a and 402b extends between the upper and lower projections 413a and 413b of the yoke 413.

A semicircular permanent magnet 406 coaxial with the circular configuration of the combination of the magnetoresistive elements 402a and 402b is bonded to a lower surface of the upper projection 413a of the yoke 413 by means of adhesive. The permanent magnet 406 rotates together with the shaft 9 and the rotor 408 about the axis of the circular configuration of the combination of the magnetoresistive elements 402a and 402b. The permanent magnet 406 is axially spaced from the circular combination of the magnetoresistive elements 402a and 402b by a given gap. As shown by the arrow M in FIG. 41, the permanent magnet 406 is magnetized in the direction parallel to the axes of the shaft 409 and the cylindrical member 412. The yoke 413 and the magnetoresistive elements 402a and 402b form a closed magnetic circuit for the magnetic field generated by the permanent magnet 406.

The magnetic field applied to the magnetoresistive elements 402a and 402b by the permanent magnet 406 is chosen to be equal to or stronger than a saturation magnetic field with respect to the magnetoresistive elements 402a and 402b as in the embodiment of FIGS. 1 and 2. Accordingly, the seventh embodiment has advantages similar to the advantages of the embodiment of FIGS. 1 and 2.

The output characteristics of the potentiometer in the seventh embodiment of this invention are basically similar to those of the potentiometer in the embodiment of FIGS. 1 and 2.

The magnetization of the permanent magnet 406 extends along the axis of the rotor 408. This design allows the axial dimension of the casing 407 to be small.

It should be noted that the magnetoresistive elements 402a and 402b may be of polygonal shapes, strip shapes, linear shapes, or other shapes. In addition, the permanent magnet 406 may be replaced by an electromagnet.

Figure 43:
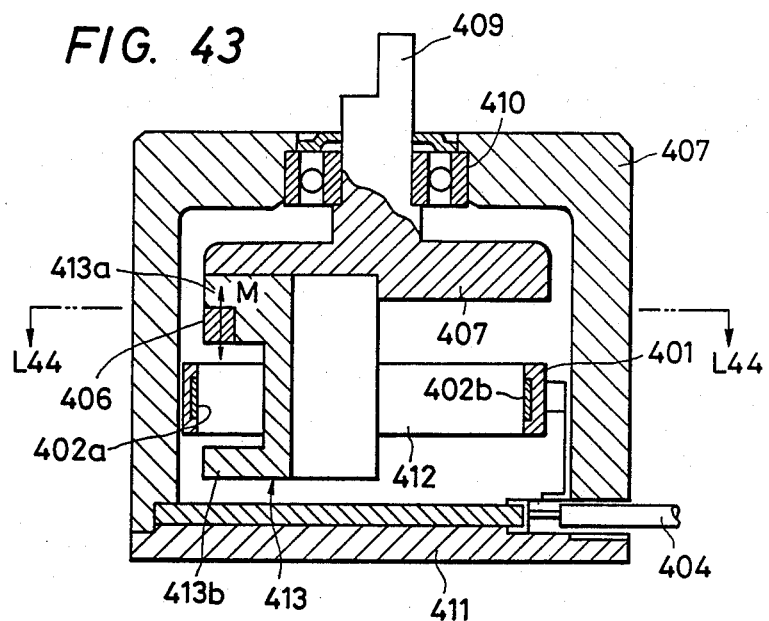
FIG. 43 is a longitudinal section view of a noncontact potentiometer according to a first modification of the seventh embodiment.
Figure 44:
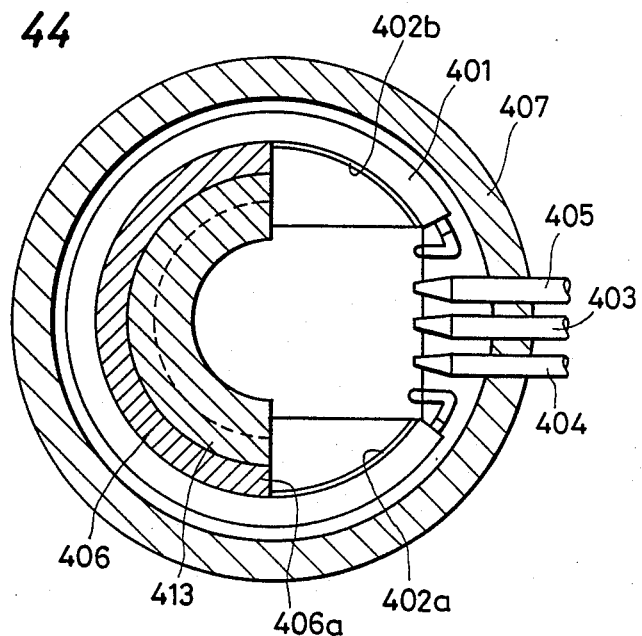
FIG. 44 is a sectional view taken along the line L44—L44 of FIG. 43.

FIGS. 43 and 44 show a first modification of the seventh embodiment of this invention. As shown in FIGS. 43 and 44, in the first modification, a member 412 holding the substrate 401 is in the form of a ring. The yoke 413 extends through the ring member 412. A portion of the ring member 412 extends between the upper and lower projections 413a and 413b of the yoke 413.

Figure 45:
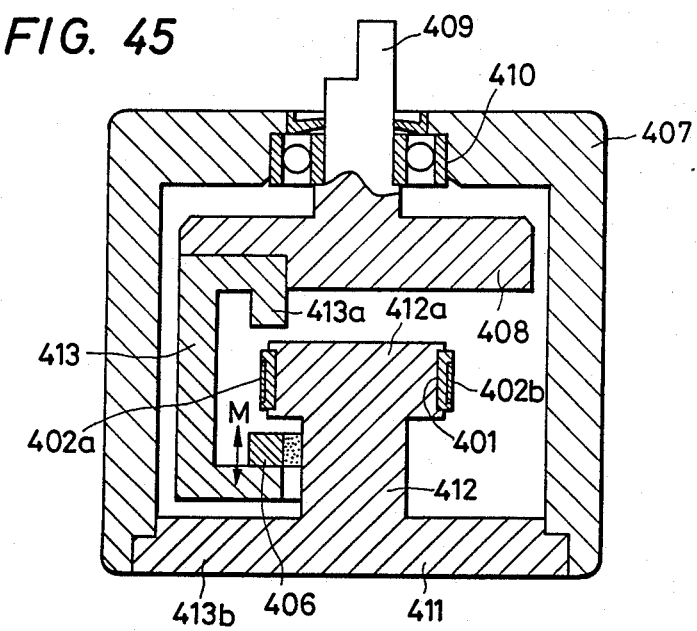
FIG. 45 is a longitudinal section view of a noncontact potentiometer according to a second modification of the seventh embodiment.

FIG. 45 shows a second modification of the seventh embodiment of this invention. As shown in FIG. 45, in the second modification, the permanent magnet 406 is bonded to an upper surface of the lower projection 413b of the yoke 413.

Figure 46:
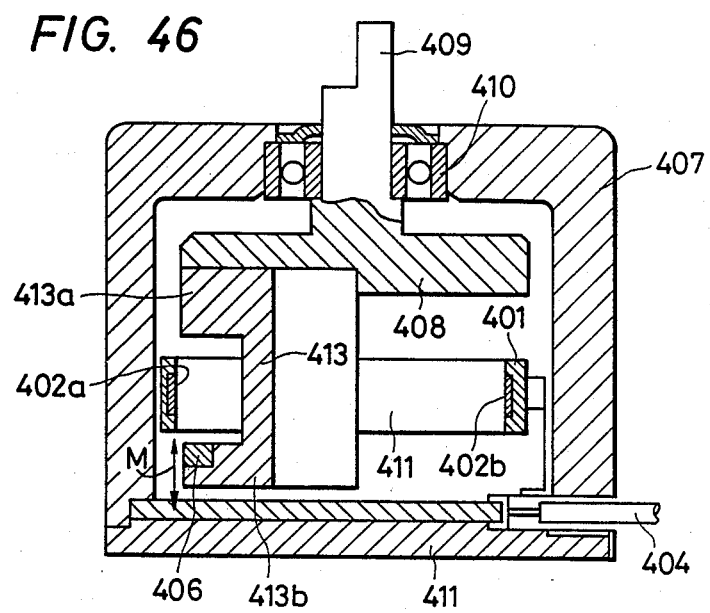
FIG. 46 is a longitudinal section view of a noncontact potentiometer according to a third modification of the seventh embodiment.

FIG. 46 shows a third modification of the seventh embodiment of this invention. The third modification is similar to the modification of FIGS. 43 and 44 except that the permanent magnet 406 is attached to the lower projection 413b of the yoke 413 as shown in FIG. 46.

DESCRIPTION OF THE EIGHTH PREFERRED EMBODIMENT

Figure 47:
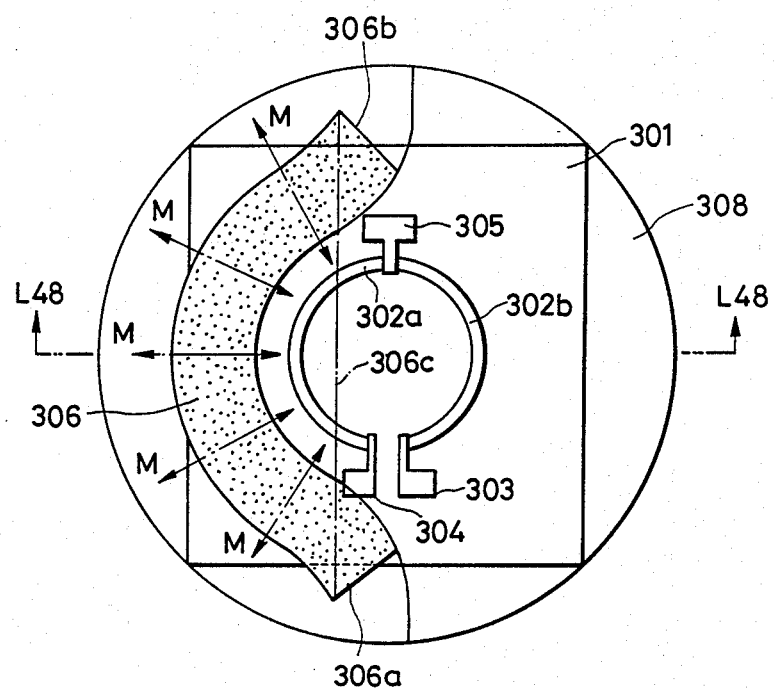
FIG. 47 is a top view of a noncontact potentiometer according to an eighth embodiment of this invention.
Figure 48:
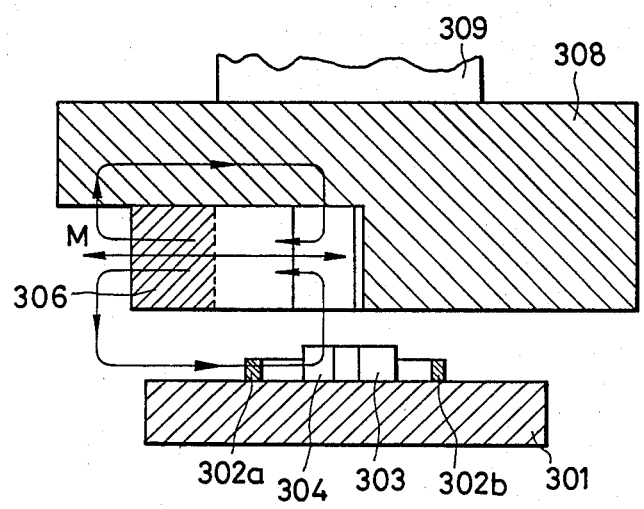
FIG. 48 is a sectional view taken along the line L48—L48 of FIG. 47.

FIGS. 47 and 48 show a noncontact potentiometer according to an eighth embodiment of this invention, which is similar to the embodiment of FIGS. 33–35 except for design changes described hereinafter.

The magnetic shields 312 (see FIGS. 33–35) are omitted from the eighth embodiment.

As shown in FIGS. 47 and 48, an approximately semicircular permanent magnet 306 extends outward of the circular combination of the magnetoresistive elements 302a and 302b. Ends 306a and 306b of the permanent magnet 306 are curved outward to reduce the magnetic field applied to the portion of the circular combination of the magnetoresistive elements 302a and 302b opposite to the permanent magnet 306. This design allows excellent potentiometer output characteristics.

The permanent magnet 306 is made of flexible material containing magnetic powder. For example, the flexible material consists of styrene-butadiene rubber (SBR). The flexible material may consist of plastics or others. As shown by the letters M in FIGS. 47 and 48, the permanent magnet 306 is magnetized radially.

During the production of the permanent magnet 306, the flexible material containing the magnetic powder is shaped into a straight bar of a rectangular cross-section. Then, the straight bar is magnetized in the direction of its thickness. This magnetization is very easy to perform. Finally, the magnetized straight bar is shaped into a desired form.

Figure 49:
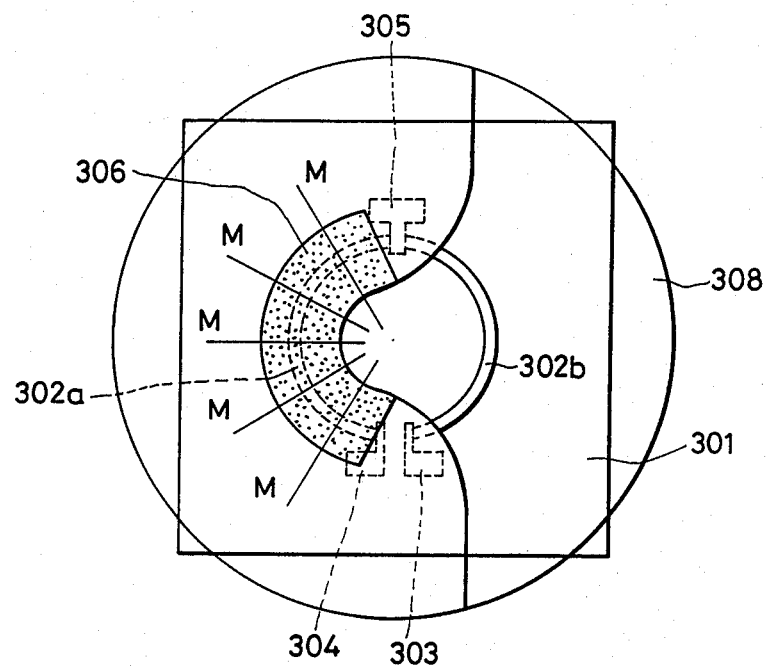
FIG. 49 is a top view of a noncontact potentiometer according to a first modification of the eighth embodiment.

FIG. 49 shows a first modification of the eighth embodiment of this invention. As shown in FIG. 49, in the first modification, a permanent magnet 306 extends in a radial range including the radial range of the circular combination of the magnetoresistive elements 302a and 302b. The permanent magnet 306 extends directly above a portion elements 302a and 302b as viewed in the axial direction. The whole of the permanent magnet 306 is in the form of an arc of a circle. In other words, the outwardly-curved portions 306a and 306b (see FIG. 47) are omitted from the permanent magnet 306.

Figure 50:
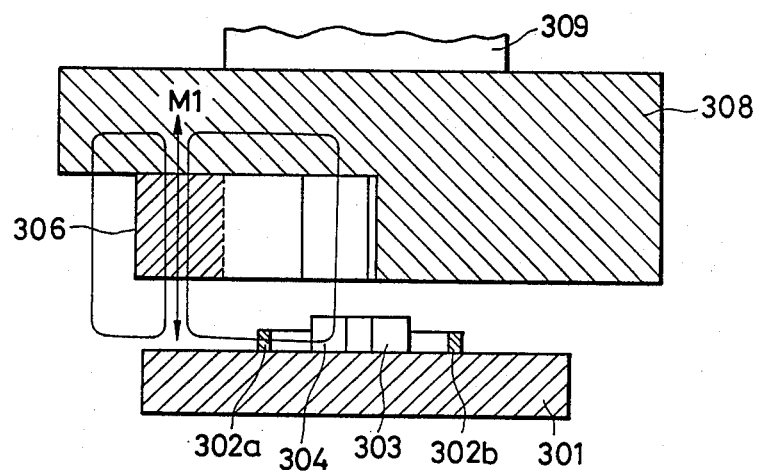
FIG. 50 is a sectional view of a noncontact potentiometer according to a second modification of the eighth embodiment.

FIG. 50 shows a second modification of the eighth embodiment of this invention. As shown by the arrow M1 in FIG. 50, in the second modification, a permanent magnet 306 is magnetized in the axial direction.

Figure 51:
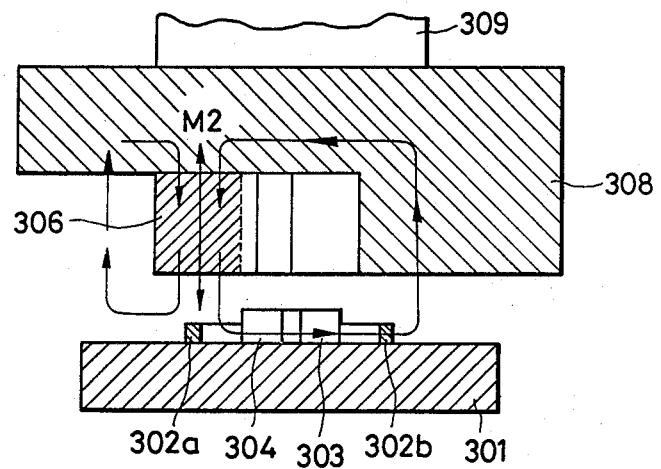
FIG. 51 is a sectional view of a noncontact potentiometer according to a third modification of the eighth embodiment.

FIG. 51 shows a third modification of the eighth embodiment of this invention. The third modification is similar to the modification of FIG. 49 except that a permanent magnet 306 is magnetized in the axial direction as shown by the arrow M2 in FIG. 51.

DESCRIPTION OF THE NINTH PREFERRED EMBODIMENT

Figure 52:
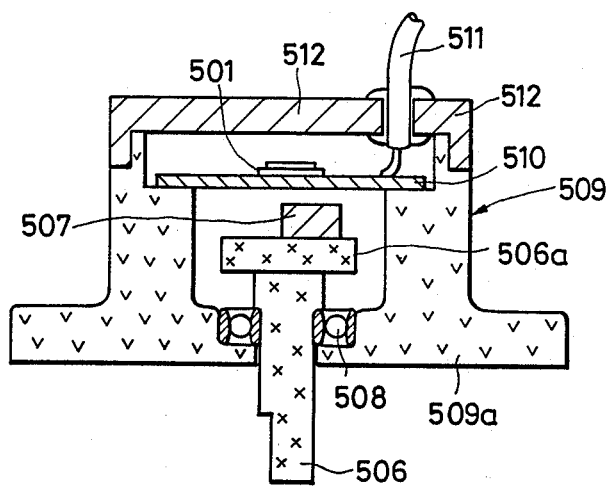
FIG. 52 is a longitudinal section view of a noncontact potentiometer according to a ninth embodiment of this invention.
Figure 53:
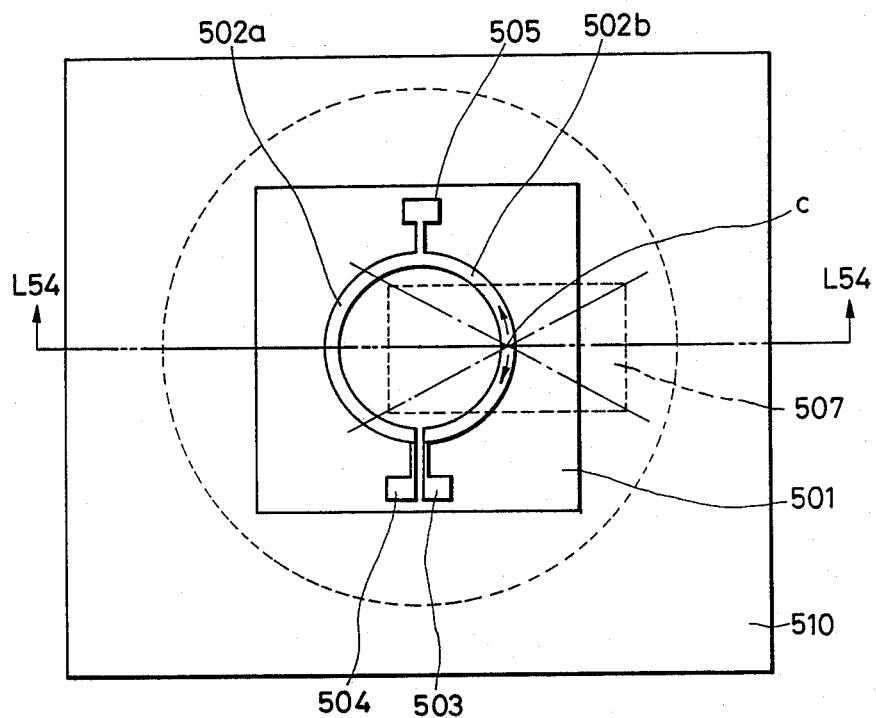
FIG. 53 is a top view of a portion of the noncontact potentiometer of FIG. 52.
Figure 54:
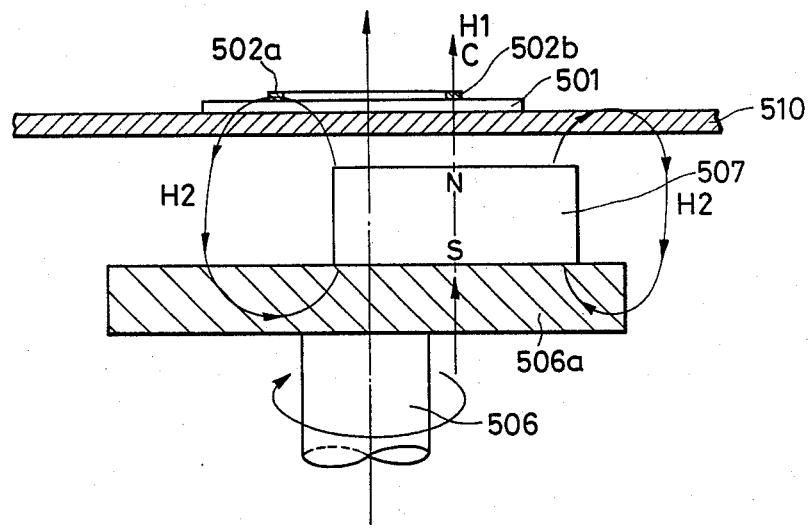
FIG. 54 is a sectional view taken along the line L54—L54 of FIG. 53.

With reference to FIGS. 52-54, a noncontact potentiometer according to a ninth embodiment of this invention includes a substrate or base plate 501 made of insulating material. Semicircular ferromagnetic magnetoresistive elements 502a and 502b fixedly extend on an upper surface of the substrate 501. The width of each of the magnetoresistive elements 502a and 502b is greater than the thickness of each of the magnetoresistive elements 502a and 502b. In other words, the radial dimension of each of the magnetoresistive elements 502a and 502b is greater than the axial dimension of each of the magnetoresistive elements 502a and 502b. The magnetoresistive elements 502a and 502b are made of material similar to the material of the magnetoresistive elements in the embodiment of FIGS. 1 and 2. The magnetoresistive elements 502a and 502b are opposed to each other so that the magnetoresitive elements 502a and 502b form a circle or ring having an opening.

The circular configuration of the combination of the magnetoresistive elements 502a and 502b has an opening defined between opposing ends of the magnetoresistive elements 502a and 502b. These opposing ends of the magnetoresistive elements 502a and 502b are connected to electrodes 504 and 503 respectively. The other ends of the magnetoresistive elements 502a and 502b are connected in common to an electrode 505. The electrode 503 is connected to the positive terminal of a constant voltage source (not shown). The electrode 504 is connected to the negative terminal of the constant voltage source via the ground. The common electrode 505 forms an output terminal.

A cylindrical casing 509 accommodating the substrate 501 has a lower end wall 509a. The lower end wall 509a supports a bearing 508 coaxial with a circular pattern of the magnetoresistive elements 502a and 502b. A control shaft 506 is rotatably supported on the lower end wall 509a via the bearing 508. The control shaft 506 extends coaxially into the casing 509 in the vertical direction as viewed in FIG. 52. A disc rotor 506a residing within the casing 509 is coaxially fixed to the shaft 506. The rotor 506a rotates together with the shaft 506. The rotor 506a can rotate about the axis of the circular pattern of the magnetoresistive elements 502a and 502b.

A rectangular permanent magnet 507 residing within the casing 509 is attached to the rotor 506a. The permanent magnet 507 rotates together with the rotor 506a and the shaft 506 about the axis of the circular pattern of the magnetoresistive elements 502a and 502b. The permanent magnet 507 is magnetized in the direction parallel to the axis of the shaft 506. This magnetization of the permanent magnet 507 can be easily performed. The permanent magnet 507 has a central axis c extending parallel to the axis of the shaft 506 and passing through the wall of a portion of the circular combination of the magnetoresistive elements 502a and 502b. During rotation of the permanent magnet 507, the central axis c of the permanent magnet 507 moves along the circular pattern of the magnetoresistive elements 502a and 502b.

A support plate 510 residing within the casing 509 is attached to an inner shoulder formed on the walls of the casing 509. The substrate 501 is mounted on the support plate 510. A portion of the circular combination of the magnetoresistive elements 502a and 502b extends directly above the permanent magnet 507 as viewed in FIGS. 52 and 54. The permanent magnet 507 is axially spaced from the circular combination of the magnetoresistive elements 502a and 502b by a given gap.

A wire harness 511 connected to the support plate 510 extends through an upper end wall 512 of the casing 509.

The magnetic field applied to the magnetoresistive elements 502a and 502b by the permanent magnet 507 is chosen to be equal to or stronger than a saturation magnetic field with respect to the magnetoresistive elements 502a and 502b as in the embodiment of FIGS. 1 and 2. Accordingly, the ninth embodiment has advantages similar to the advantages of the embodiment of FIGS. 1 and 2.

The output characteristics of the potentiometer in the ninth embodiment of this invention are basically similar to those of the potentiometer in the embodiment of FIGS. 1 and 2.

As shown in FIG. 54, the permanent magnet 507 applies an axial magnetic filed H1 to a portion of the combination of the magnetoresistive elements 502a and 502b on the same side as the permanent magnet 507. The permanent magnet 507 applies a radial magnetic field H2 to a portion of the combination of the magnetoresistive elements 502a and 502b on the side opposite to the permanent magnet 507. In general, the application of the radial magnetic field H2 to the magnetoresistive elements 502a and 502b causes a considerably greater decrease in the resistances of the magnetoresistive elements 502a and 502b than that by the application of the axial magnetic field H1 to the magnetoresistive elements 502a and 502b. Accordingly, variations in the potentiometer output can be enhanced and the potentiometer linearity characteristics can be excellent.

It should be noted that the permanent magnet 507 may be of other shapes.

Figure 55:
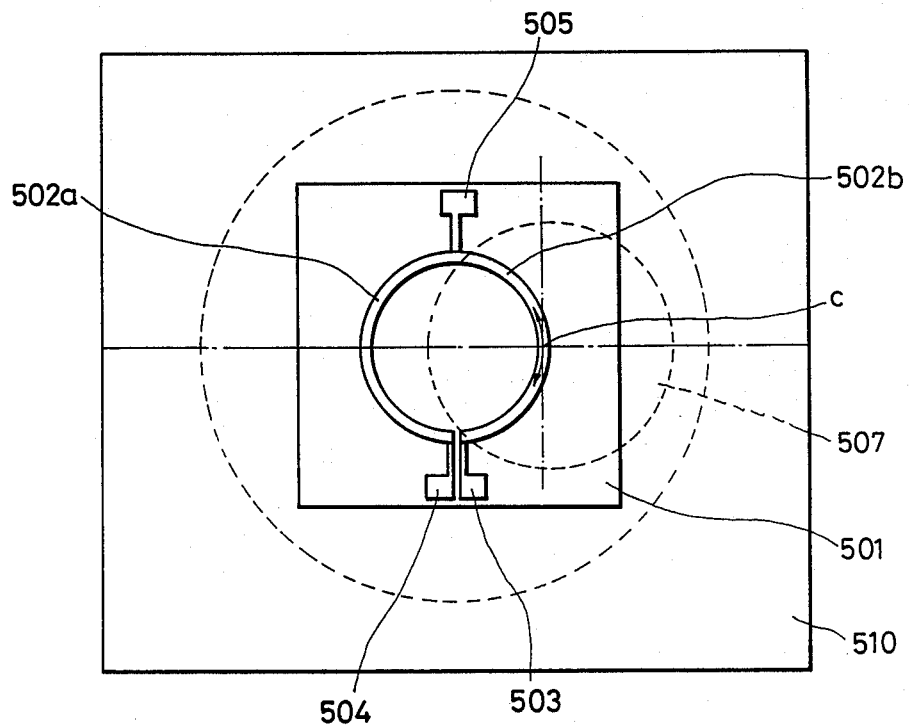
FIG. 55 is a top view of a portion of a noncontact potentiometer according to a modification of the ninth embodiment.

FIG. 55 shows a modification of the ninth embodiment of this invention. As shown in FIG. 55, in the modification, a permanent magnet 507 is in the form of a disc.

What is claimed is:
1. A potentiometer comprising:
   (a) a substrate;
   (b) a magnetoresistive element made of ferromagnetic material formed as a substantially circular film on the substrate;
   (c) magnetic field applying means being magnetized along a width thereof and being spaced from the magnetoresistive element by a predetermined gap and opposing a portion of the magnetoresistive element, for applying a first magnetic field to a portion of the magnetoresistive element opposing the field applying means, and for applying a second magnetic field to another portion of the magnetoresistive element, the first magnetic field extending in a vertical direction with respect to the substrate and the second magnetic field extending in a radial direction with respect to the magnetoresistive element said first and second magnetic fields being applied so that substantially all of the magneto resistive element is subjected to either the first magnetic field or the second magnetic field, wherein absolute values of the first and second magnetic fields applied to the magnetoresistive element are equal to or greater than the saturation magnetic field of the ferromagnetic magnetoresistive element;

(d) rotating means for rotating the magnetoresistive element and the field applying means so that the field applying means moves along a circumferential direction of the magnetoresistive element in accordance with the rotation of the rotating means; and (e) detecting means for detecting a variation of the resistance of the magnetoresistive element cause by rotation of one of the magnetoresistive element and the field applying means, and for detecting said rotation of the magnetoresistive element and the field applying means.

2. The potentiometer of claim 1 wherein a central axis of the field applying means along an axis of said rotation extends through the magnetoresistive element.

3. The potentiometer of claim 1 wherein the field applying means comprises a magnet magnetized along a direction parallel to an axis of said rotation.

4. The potentiometer of claim 1 wherein the rotating means comprises a rotatable shaft extending coaxially with the magnetoresistive element, and the magnetic field applying means comprises a magnet fixed to the shaft and being rotatable about a central axis of the magnetoresistive element.

5. A potentiometer comprising:
(a) a substrate;
(b) a magnetoresistive element made of ferromagnetic material and being formed as a film on the substrate;
(c) means, spaced from the magnetoresistive element by a predetermined gap, for applying a first magnetic field to the magnetoresistive element, the first magnetic field being stationary with respect to the magnetoresistive element;
(d) means for applying a second magnetic field to the magnetoresistive element, said first magnetic field and said second magnetic field combining to form a resultant magnetic field so that substantially all of the magnetoresistive element is subjected to either the first magnetic field or the second magnetic field;
(e) means for moving the second magnetic field relative to the magnetoresistive element; and
(f) means for detecting a variation in a resistance of the magnetoresistive element caused by a variation in the resultant magnetic field caused by movement of the second magnetic field relative to the magnetoresistive element, and thus for detecting said movement of the second magnetic field.

6. A potentiometer comprising:
(a) a substrate;
(b) a substantially circular magnetoresistive element made of ferromagnetic material formed as film on the substrate, the circular magnetoresistive element having an opening and opposite ends opposing each other via the opening;
(c) means, spaced from the magnetoresistive element by a predetermined gap, for applying a magnetic field to a portion of the magnetoresistive element in a direction along a width of the magnetoresistive element, where an absolute value of the magnetic field applied to the magnetoresitive element is equal to or greater than a saturation magnetic field of the ferromagnetic magnetoresistive element;
(d) means for moving the field applying means relative to the magnetoresistive element along a longitudinal direction of the magnetoresistive element; and
(e) means for causing an electric current to flow from one of the ends of the magnetoresistive elements to the other end through the magnetoresistive element;
(f) an output terminal connected to a point of the magnetoresistive element which is located between the ends of the magnetoresistive element, the output terminal outputting an electric signal; and
(g) means for detecting said movement of the field applying means relative to the magnetoresistive element on the basis of the electric signal outputted from the output terminal.

7. The potentiometer of claim 6 wherein said point at which said output terminal is connected of the magnetoresistive element is equidistant from the ends of the magnetoresistive element, and wherein the field applying means comprises a semicircular magnet.

* * * * *